United States Patent
Sabin

(10) Patent No.: US 12,062,912 B2
(45) Date of Patent: Aug. 13, 2024

(54) SYSTEMS AND METHODS FOR AUTOMATICALLY CHARACTERIZING DISTURBANCES IN AN ELECTRICAL SYSTEM

(71) Applicant: Schneider Electric USA, Inc., Andover, MA (US)

(72) Inventor: Daniel Douglas Sabin, Danvers, MA (US)

(73) Assignee: Schneider Electric USA, Inc., Boston, MA (US)

( * ) Notice: Subject to any disclaimer, the term of this patent is extended or adjusted under 35 U.S.C. 154(b) by 269 days.

(21) Appl. No.: 17/621,533

(22) PCT Filed: Apr. 15, 2020

(86) PCT No.: PCT/US2020/028305
§ 371 (c)(1),
(2) Date: Dec. 21, 2021

(87) PCT Pub. No.: WO2021/002916
PCT Pub. Date: Jan. 7, 2021

(65) Prior Publication Data
US 2022/0360076 A1    Nov. 10, 2022

Related U.S. Application Data

(60) Provisional application No. 62/870,305, filed on Jul. 3, 2019.

(51) Int. Cl.
*H02H 3/20* (2006.01)
*G01R 31/08* (2020.01)
*H02J 3/00* (2006.01)

(52) U.S. Cl.
CPC .......... *H02J 3/0012* (2020.01); *G01R 31/086* (2013.01); *H02H 3/20* (2013.01); *H02H 3/207* (2013.01); *H02J 3/00* (2013.01)

(58) Field of Classification Search
CPC ........ H02J 3/00; H02J 3/0012; H02J 3/00125; H02H 3/20; H02H 3/207; H02H 3/083;
(Continued)

(56) References Cited

U.S. PATENT DOCUMENTS 7,043,661 B2    5/2006  Valadarsky et al.
8,000,910 B2    8/2011  Bickel
(Continued)

FOREIGN PATENT DOCUMENTS

| EP | 2264850 A2 | 12/2010 |
| EP | 3223022 A1 | 9/2017 |
| EP | 3229031 A1 | 10/2017 |

OTHER PUBLICATIONS

Extended European Search Report and Search Opinion dated Jan. 9, 2023 for corresponding European Patent Application No. EP20834580. 1, 8 pages.
(Continued)

*Primary Examiner* — Danny Nguyen
(74) *Attorney, Agent, or Firm* — Locke Lord LLP

(57) ABSTRACT

A method includes capturing at least one energy-related waveform using at least one intelligent electronic device in an electrical system, and processing electrical measurement data from, or derived from, the at least one energy-related waveform to identify disturbances in the electrical system. In response to identifying the disturbances in the electrical system, each sample of the at least one energy-related waveform associated with the identified disturbances is analyzed and categorized into one of a plurality of disturbance categories. The disturbance categories may include voltage sags due to upline electrical system disturbances, voltage sags due to downline electrical system faults, voltage sags due to downline transformer and/or motor magnetization, and voltage sags due to other downline disturbances. A disturbance categorization is determined for the at (Continued)

least one energy-related waveform based on the categorization of each sample. An action is taken based on the disturbance categorization.

24 Claims, 14 Drawing Sheets

(58) Field of Classification Search
CPC . H02H 3/13; H02H 3/50; G01R 31/08; G01R 31/086; Y04S 10/52
USPC .................................................. 361/62–69
See application file for complete search history.

(56) References Cited

U.S. PATENT DOCUMENTS

| | | | |
|---|---|---|---|
| 8,867,371 | B2 | 10/2014 | Bowler et al. |
| 2011/0213577 | A1 | 9/2011 | Mousavi et al. |
| 2017/0285114 | A1 | 10/2017 | Bickel et al. |
| 2019/0245343 | A1* | 8/2019 | Porter .................... G01R 19/02 |
| 2019/0271725 | A1* | 9/2019 | Chowdhury ....... G01R 19/2513 |

OTHER PUBLICATIONS

International Search Report and written opinion dated Jul. 17, 2020 for PCT/US2020/28305 (Form PCT/ISA/210), 10 pages.

* cited by examiner

SYSTEMS AND METHODS FOR AUTOMATICALLY CHARACTERIZING DISTURBANCES IN AN ELECTRICAL SYSTEM

CROSS REFERENCE TO RELATED APPLICATION

This application claims the benefit of and priority to U.S. Provisional Application No. 62/870,305, filed on Jul. 3, 2019 under 35 U.S.C. § 119(e), which application is incorporated by reference herein in its entirety.

FIELD

This disclosure relates generally to electrical/power systems, and more particularly, to systems and methods for automatically characterizing disturbances in an electrical system.

BACKGROUND

As is known, power quality issues are one of the most significant and costly impacts on electrical systems (also sometimes referred to as "electrical networks"). Poor power quality is estimated to cost the European economy up to €150 billion annually, according to the Leonardo Power Quality Initiative.[1] Additionally, the U.S. economy experiences losses ranging from $119 billion to $188 billion annually, according to research by the Electric Power Research Institute (EPRI).[2] Perhaps the most important statistic is the EPRI finding that 80 percent of power-quality disturbances are generated within a facility. One exemplary economic model summarizes the total cost associated with power quality events as follows:

[1] https://adfpowertuning.com/en/about-us/news-stories/148-leonardo-energy-gpan-european-power-quality-surveyg-shows-g150gn-annually-in-cost-for-lower-power-qaulity.html
[2] https://blog.schneider-electric.com/power-management-metering-monitoring-power-quality/2015/10/16/why-poor-power-quatliy-costs-billions-annually-and-what-can-be-done-about-it/

> Total losses=production losses+restart losses+product/material losses+equipment losses+third-party costs+other miscellaneous costs[3]

[3] The Cost of Poor Power Quality, Roman Targosz and David Chapman, October 2015, ECI Publication No. Cu0145

Other miscellaneous costs associated with power quality issues may include intangible losses such as a damaged reputation with customers and suppliers or more direct losses such as the devaluation of credit ratings and stock prices.

SUMMARY

Described herein are systems and methods related to automatically categorizing or classifying disturbances in an electrical system. The electrical system may be associated with at least one load, process, building, facility, watercraft, aircraft, or other type of structure, for example. In one aspect of this disclosure, a method for automatically categorizing disturbances (or perturbances) in an electrical system includes capturing energy-related waveforms using at least one intelligent electronic devices (IED) in the electrical system. The at least one energy-related waveform may include, for example, at least one of: voltage waveforms, current waveforms, and other waveforms and/or data (e.g., power) derived from the voltage waveforms and/or the current waveforms. In accordance with some embodiments of this disclosure, the voltage waveforms and the current waveforms may include at least one of: single-phase and three-phase voltage and current waveforms. These waveforms may be sampled at a variety of rates, for example, a rate of about 100 Hz or above. In one example implementation, the rate is about 1.6 kHz.

The method also includes processing electrical measurement data from, or derived from, the at least one energy-related waveform to identify disturbances in the electrical system. In response to identifying a disturbance in the electrical system, each sample of the energy-related waveforms associated with the identified disturbance is analyzed and categorized into one of a plurality of disturbance categories. The disturbance categories may include, for example, (a) voltage sags due to upline electrical system disturbances, (b) voltage sags due to downline electrical system faults, (c) voltage sags due to downline transformer and/or motor magnetization, and (d) voltage sags due to other downline disturbances.

The method also includes determining a disturbance categorization for the at least one energy-related waveform associated with the identified disturbance based on the categorization of each sample of the at least one energy-related waveform. The disturbance categorization may, for example, be selected from one of the disturbance categories. In some embodiments, at least one action may be taken based on the disturbance categorization for the at least one energy-related waveform. For example, the actions may include at least one of communicating the disturbance categorization and controlling at least one component in the electrical system. In one example situation in which electrical system equipment trips offline due to the voltage sag or current magnitude of an inrush event, if a waveform measurement is determined to be an inrush measurement rather than a fault by the method, the operator of an electrical system informed that it was inrush could re-energize the system without first completing a time-consuming search for an electrical fault. In some embodiments, the decision to re-energize the system may be completed manually by a human operator and/or be part of an automated electrical control system. As is known, electrical events, such as faults, may result in undesirable impacts on electrical systems and systems, devices and/or equipment associated with and/or proximate to the electrical systems. In accordance with embodiments of this disclosure, the method may eliminate or at least significantly reduce the undesirable impacts (e.g., manhole explosion caused by a fault in underground electrical equipment), for example, due to the at least one action being taken.

The method may be implemented, for example, on at least one of the at least one IED or other electric power meters, a microprocessor relay, into the edge server software or gateway that may collect measurements from the monitoring devices, and/or into cloud-based advisor services. It is understood that there are but a few of many possible ways in which the method may be implemented.

It is also understood that the at least one energy-related waveform capture described above in connection with the method (and other methods and systems discussed below) may be associated with energy-related signals captured or measured by the at least one IED. For example, in accordance with some embodiments of this disclosure, the at least one energy-related waveform capture may be generated from at least one energy-related signal captured or measured by the at least one IED. According to IEEE Standard 1057-2017, a waveform is "[a] manifestation or representation (e.g., graph, plot, oscilloscope presentation, discrete time series, equations, table of coordinates, or statistical data) or a visualization of a signal." With this definition in mind, the at least one energy-related waveform may correspond to a manifestation or representation or a visualization of the at least one energy-related signal. It is understood that the above relationship is based on one standards body's (IEEE in this case) definition of a waveform, and other relationships between a waveform and a signal are of course possible, as will be understood by one of ordinary skill in the art.

The above method, and the other methods (and systems) described below, may include one or more of the following features either individually or in combination with other features in some embodiments. Processing electrical measurement data from, or derived from, the at least one energy-related waveform to identify disturbances in the electrical system, may include determining voltage and current phase information of the electrical measurement data associated with the disturbances, and analyzing the voltage and current phase information to determine if the source(s) of the disturbances is/are electrically upstream or downstream from electrical nodes or locations in the electrical system where the at least one IED is electrically coupled.

Additionally, or alternatively, processing the electrical measurement data may include grouping the electrical measurement data based on electrical nodes or locations in the electrical system associated with the at least one energy-related waveform, and processing the grouped electrical measurement data to identify disturbances at the electrical nodes or locations. The electrical measurement data may be grouped, for example, using temporal aggregation techniques such that measurements that occurred proximate in time are grouped together. Sampling rates at which the at least one energy-related waveform associated with the electrical measurement data was captured may be determined, and the sampling rates of the electrical measurement data may be adjusted to a desired sampling rate to at least one of align and group the electrical measurement data. The sampling rates the electrical measurement data may be adjusted, for example, by upsampling, downsampling and/or resampling the electrical measurement data. In accordance with some embodiments of this disclosure, the desired sampling rate is a lowest sampling rate of the sampling rates at which the at least one energy-related waveform associated with the electrical measurement data was captured.

In accordance with some embodiments of this disclosure, the electrical measurement data from, or derived from, the at least one energy-related waveform captured by the at least one IED may be processed on at least one of: the cloud-based system, the on-site software, the gateway, and the other head-end system associated with the electrical system. The at least one IED may be communicatively coupled to the at least one of: the cloud-based system, the on-site software, the gateway, and the other head-end system on which the electrical measurement data is processed.

Determining a disturbance categorization for the at least one energy-related waveform may include analyzing the categorization of each sample of the at least one energy-related waveform to develop a confidence factor on a disturbance categorization for the at least one energy-related waveform, and in response to the confidence factor of the disturbance characterization meeting a threshold, determining the disturbance categorization for the at least one energy-related waveform. In accordance with some embodiments of this disclosure, analyzing the categorization of each sample of the energy-related waveforms includes identifying categorization patterns of the energy-related waveform samples.

Taking one or more actions based on the disturbance categorization may include triggering one or more alarms based on the disturbance categorization. In accordance with some embodiments of this disclosure, the alarms are prioritized based on importance/criticality of electrical node or location where the disturbance originated. Additionally, in accordance with some embodiments of this disclosure, the alarms are prioritized based on size of the load measured at the electrical node or location where the disturbance originated. In some embodiments, in response to the alarms being triggered, the disturbance may be reported and/or at least one component in the electrical system may be operated in response to the disturbance to prevent or reduce damage to electrical system equipment. The one or more actions may be automatically performed, for example, by a control system associated with the electrical system. The control system may be communicatively coupled to the at least one IED, and/or to a cloud-based system, on-site/edge software, a gateway, and another head-end system associated with the electrical system.

A corresponding system for automatically categorizing disturbances in an electrical system is also provided herein. In particular, in one aspect a system for automatically categorizing disturbances in an electrical system includes at least one processor and at least one memory device coupled to the at least one processor. The at least one processor and the at least one memory device are configured to process electrical measurement data from, or derived from, at least one energy-related waveform captured by at least one IED in the electrical system to identify disturbances in the electrical system. The at least one processor and the at least one memory device are also configured to analyze and categorize each sample of the at least one energy-related waveform associated with an identified disturbance into one of a plurality of disturbance categories. Similar to the method described above, the disturbance categories may include, for example, (a) voltage sags due to upline electrical system disturbances, (b) voltage sags due to downline electrical system faults, (c) voltage sags due to downline transformer and/or motor magnetization, and (d) voltage sags due to other downline disturbances.

The at least one processor and the at least one memory device are additionally configured to determine a disturbance categorization for the at least one energy-related waveform associated with the identified disturbance based on the categorization of each sample of the at least one energy-related waveform. Similar to the method described above, the disturbance categorization may, for example, be selected from one of the disturbance categories. At least one action may be taken by the at least one processor and the at least one memory device (or other systems and devices in the electrical system) based on the disturbance categorization for the at least one energy-related waveform. In some embodiments, the one or more actions include generating an output signal in accordance with the disturbance categorization, and providing the output signal to at least one device for further processing. In some embodiments, the at least one device includes at least one of: the at least one IED, a control system associated with the electrical system, a cloud-based system, on-site/edge software, a gateway, and another head-end system associated with the electrical system.

In some embodiments, the above-described system may correspond to a control system used for monitoring or controlling one or more parameters associated with the electrical system. In some embodiments, the control system may be a meter, an IED (e.g., of the IEDs responsible for capturing the energy-related waveforms), on-site/head-end software (i.e., a software system), a cloud-based control system, a gateway, a system in which data is routed over the Ethernet or some other communications system, etc.

As used herein, an IED is a computational electronic device optimized to perform a particular function or set of functions. Examples of IEDs include smart utility meters, power quality meters, microprocessor relays, digital fault recorders, and other metering devices. IEDs may also be imbedded in variable speed drives (VSDs), uninterruptible power supplies (UPSs), circuit breakers, relays, transformers, or any other electrical apparatus. IEDs may be used to perform monitoring and control functions in a wide variety of installations. The installations may include utility systems, industrial facilities, warehouses, office buildings or other commercial complexes, campus facilities, computing co-location centers, data centers, power distribution networks, or any other structure, process or load that uses electrical energy For example, where the IED is an electrical power monitoring device, it may be coupled to (or be installed in) an electrical power transmission or distribution system and configured to sense/measure and store data as electrical parameters representing operating characteristics (e.g., voltage, current, waveform distortion, power, etc.) of the electrical distribution system. These parameters and characteristics may be analyzed by a user to evaluate potential performance, reliability or power quality-related issues. The IED may include at least a controller (which in certain IEDs can be configured to run one or more applications simultaneously, serially, or both), firmware, a memory, a communications interface, and connectors that connect the IED to external systems, devices, and/or components at any voltage level, configuration, and/or type (e.g., AC, DC). At least certain aspects of the monitoring and control functionality of an IED may be embodied in a computer program that is accessible by the IED.

In some embodiments, the term "IED" as used herein may refer to a hierarchy of IEDs operating in parallel and/or tandem. For example, an IED may correspond to a hierarchy of energy meters, power meters, and/or other types of resource meters. The hierarchy may comprise a tree-based hierarchy, such as a binary tree, a tree having one or more child nodes descending from each parent node or nodes, or combinations thereof, wherein each node represents a specific IED. In some instances, the hierarchy of IEDs may share data or hardware resources and may execute shared software. It is understood that hierarchies may be non-spatial such as billing hierarchies where IEDs grouped together may be physically unrelated.

In some embodiments, the metering devices (e.g., IEDs) and equipment/loads of the above and below described systems and methods are installed, located or derived from different respective locations (i.e., a plurality of locations) or metering points in the electrical system. A particular IED (e.g., a second IED) may be upline (or upstream) from another IED (e.g., a third IED) in the electrical system while being downline (or downstream) from a further IED (e.g., a first IED) in the electrical system, for example.

As used herein, the terms "upline" and "downline" (also sometimes referred to as "upstream" and "downstream", respectively) are used to refer to electrical locations within an electrical system. More particularly, the electrical locations "upline" and "downline" are relative to an electrical location of an IED collecting data and providing this information. For example, in an electrical system including a plurality of IEDs, one or more IEDs may be positioned (or installed) at an electrical location that is upline relative to one or more other IEDs in the electrical system, and the one or more IEDs may be positioned (or installed) at an electrical location that is downline relative to one or more further IEDs in the electrical system. A first IED or load that is positioned on an electrical circuit upline from a second IED or load may, for example, be positioned electrically closer to an input or source of the electrical system (e.g., an electrical generator or a utility feed) than the second IED or load. Conversely, a first IED or load that is positioned on an electrical circuit downline from a second IED or load may be positioned electrically closer to an end or terminus of the electrical system than the other IED.

A first IED or load that is electrically connected in parallel (e.g., on an electrical circuit) with a second IED or load may be considered to be "electrically" upline from said second IED or load in embodiments, and vice versa. In embodiments, algorithm(s) used for determining a direction of a power quality event (i.e., upline or downline) is/are located (or stored) in the IED, cloud, on-site software, gateway, etc. As one example, the IED can record an electrical event's voltage and current phase information (e.g., by sampling the respective signals) and communicatively transmit this information to a cloud-based system. The cloud-based system may then analyze the voltage and current phase information (e.g., instantaneous, root-mean-square (rms), waveforms and/or other electrical characteristic) to determine if the source of the power quality event was electrically upline or downline from where the IED is electrically coupled to the electrical system (or network).

It is understood there are types of power quality events and there are certain characteristics of these types of power quality events. A power quality event may include at least one of a voltage sag, a voltage swell, and a voltage transient, for example. According to IEEE Standard 1159-2019, for example, a voltage sag is a decrease to between 0.1 and 0.9 per unit (pu) in rms voltage or current at the electrical frequency for durations of 0.5 cycle to 1 min. Typical values are 0.1 to 0.9 pu. Additionally, according to IEEE Standard 1159-2019, a voltage swell is an increase in rms voltage or current at the electrical frequency for durations from 0.5 cycles to 1 min. Below is a table from IEEE Standard 1159-2019 (known art), which defines various categories and characteristics of power system electromagnetic phenomena.

| Categories | Typical spectral content | Typical duration | Typical voltage magnitude |
|---|---|---|---|
| 1.0 Transients | | | |
| 1.1 Impulsive | | | |
| 1.1.1 Nanosecond | 5 ns rise | <50 ns | |
| 1.1.2 Microsecond | 1 μs rise | 50 ns-1 ms | |
| 1.1.3 Millisecond | 0.1 ms rise | >1 ms | |

-continued

| Categories | Typical spectral content | Typical duration | Typical voltage magnitude |
|---|---|---|---|
| 1.2 Oscillatory | | | |
| 1.2.1 Low frequency | <5 kHz | 0.3-50 ms | 0-4 pu[a] |
| 1.2.2 Medium frequency | 5-500 kHz | 20 μs | 0-8 pu |
| 1.2.3 High frequency | 0.5-5 MHz | 5 μs | 0-4 pu |
| 2.0 Short-duration root-mean-square (rms) variations | | | |
| 2.1 Instantaneous | | | |
| 2.1.1 Sag | | 0.5-30 cycles | 0.1-0.9 pu |
| 2.1.2 Swell | | 0.5-30 cycles | 1.1-1.8 pu |
| 2.2 Momentary | | | |
| 2.2.1 Interruption | | 0.5 cycles - 3 s | <0.1 pu |
| 2.2.2 Sag | | 30 cycles - 3 s | 0.1-0.9 pu |
| 2.2.3 Swell | | 30 cycles - 3 s | 1.1-1.4 pu |
| 2.2.4 Voltage Imbalance | | 30 cycles - 3 s | 2%-15% |
| 2.3 Temporary | | | |
| 2.3.1 Interruption | | >3 s-1 min | <0.1 pu |
| 2.3.2 Sag | | >3 s-1 min | 0.1-0.9 pu |
| 2.3.3 Swell | | >3 s-1 min | 1.1-1.2 pu |
| 2.3.4 Voltage Imbalance | | >3 s-1 min | 2%-15% |
| 3.0 Long duration rms variations | | | |
| 3.1 Interruption, sustained | | >1 min | 0.0 pu |
| 3.2 Undervoltages | | >1 min | 0.8-0.9 pu |
| 3.3 Overvoltages | | >1 min | 1.1-1.2 pu |
| 3.4 Current overload | | >1 min | |
| 4.0 Imbalance | | | |
| 4.1 Voltage | | steady state | 0.5-5% |
| 4.2 Current | | steady state | 1.0-3.0% |
| 5.0 Waveform distortion | | | |
| 5.1 DC offset | | steady state | 0-0.1% |
| 5.2 Harmonics | 0.9 kHz | steady state | 0-20% |
| 5.3 Interharmonics | 0-9 kHz | steady state | 0-2% |
| 5.4 Notching | | steady state | |
| 5.5 Noise | broadband | steady state | 0-1% |
| 6.0 Voltage fluctuations | <25 Hz | intermittent | 0.1-7% 0.2-2 $P_{st}$[b] |
| 7.0 Power frequency variations | | <10 s | ±0.10 Hz |

NOTE

These terms and categories apply to power quality measurements and are not to be confused with similar terms defined in IEEE Std 1366™-2012 [B30] and other reliability-related standards, recommended practices, and guides.
[a]The quantity pu refers to per unit, which is dimensionless. The quantity 1.0 pu corresponds to 100%. The nominal condition is often considered to be 1.0 pu. In this table, the nominal peak value is used as the base for transients and the nominal rms value is used as the base for rms variations.
[b]Flicker severity index $P_{st}$ as defined in IEC 61000-4-15: 2010 [B17] and IEEE Std 1453™ [B31].

It is understood that the above table is one standards body's (IEEE in this case) way of defining/characterizing power quality events. It is understood there are other standards that define power quality categories/events as well, such as the International Electrotechnical Commission (IEC), American National Standards Institute (ANSI), etc., which may have different descriptions or power quality event types, characteristics, and terminology. It is also understood that the types and descriptions of power quality events may change over time, and the systems and methods disclosed herein are intended to be applicable to current and future types and descriptions of power quality events. In accordance with embodiments of this disclosure, power quality events may additionally or alternatively be customized power quality events (e.g., defined by a user).

Of the seven recognized power quality categories defined by IEEE 1159-2019, short-duration root mean square (rms) variations are generally the most disruptive and have the largest universal economic impact on energy consumers. Short-duration rms variations include voltage sags/dips, swells, momentary interruptions and temporary interruptions. One example study by the Electric Power Research Institute (EPRI) estimates an average of about 66 voltage sags are experienced by industrial customers each year. As the trend of industries becoming more dependent on sag-sensitive equipment has increased, so has the impact of these events.

The most common cause of voltage sags are short circuits in the electrical system (also known as electric power system faults) either upline of the monitoring location (that is, towards the electric power source) or downline of the monitoring location (that is, away from the source). Voltage sags can also be due to energizing of power transformers or the startup of large loads. When the source of a voltage sag is downline of the monitoring location, different voltage and current waveform signatures will be measured based on whether the cause of the voltage sag was due to a fault, due to the large inrush current associated with energizing a transformer and/or motor, or due to a large load startup.

The systems and methods disclosed herein automatically distinguish/categorize voltage sag measurements (and other types of measurements) into a plurality of categories. For example, with respect to voltage sag measurements, the systems and methods disclosed herein may categorize voltage sag measurements into voltage sags due to upline disturbances, voltage sags due to downline faults, voltage sags due to downline transformer and/or motor energizing inrush, and voltage sags due to other downline disturbances that do not have fault or inrush characteristics, as a few examples.

Being able to distinguish between a downline fault event and a downline inrush event is important because it allows the operator of an electrical system or electric facility to take appropriate action when other electric power equipment trips offline due to a voltage sag or when a protective device operates due to large current inrush. If a meter firmware or server software application utilizing the invention provided a notification that there was a fault, then the operator of the impacted equipment (and/or the system(s) on which the disclosed methods are implemented) could choose to not restart the equipment until the location of the fault had been identified and possibly repaired. However, if an inrush measurement or large load startup was detected, then the impacted equipment could be restarted without completing a time-consuming search for a nonexistent fault.

It is understood that there are many other advantages associated with the disclosed systems and methods, as will be appreciated from the discussions below.

BRIEF DESCRIPTION OF THE DRAWINGS

The foregoing features of the disclosure, as well as the disclosure itself may be more fully understood from the following detailed description of the drawings, in which.

DETAILED DESCRIPTION

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected.

For convenience, certain introductory concepts and terms used in the specification (and adopted or derived from IEEE Standard 1159-2019) are collected here.

As used herein, the term "aperiodic event" is used to describe an electrical event that occurs non-cyclically, arbitrarily or without specific temporal regularity. For the sake of this paper, both short-duration root-mean-square (rms) variations and transients are considered to be aperiodic events (i.e., notching is considered as a harmonic phenomenon).

As used herein, the term "momentary interruption" is used to describe a deviation to 0-10% of the nominal value for a duration of ½ cycles to 3 seconds.

As used herein, the term "sag" (of which a "voltage sag" is one example) is used to describe a deviation to 10-90% of the nominal value, for example, for a duration of ½ cycle to 1 minute.

As used herein, the term "short-duration rms variation" is used to describe a deviation from the nominal value with a duration of ½ cycle to 1 minute. Sub-categories of short-duration rms variation events include momentary interruptions, temporary interruptions, sags and swells.

As used herein, the term "swell" is used to describe a deviation greater than 110% of the nominal value, for example, for a duration of ½ cycle to 1 minute.

As used herein, the term "temporary interruption" is used to describe a deviation to 0-10% of the nominal value for a duration of 3 seconds to 1 minute.

As used herein, the term "transient" is used to describe a deviation from the nominal value with a duration less than 1 cycle. Sub-categories of transients include impulsive (uni-direction polarity) and oscillatory (bi-directional polarity) transients.

Figure 9:
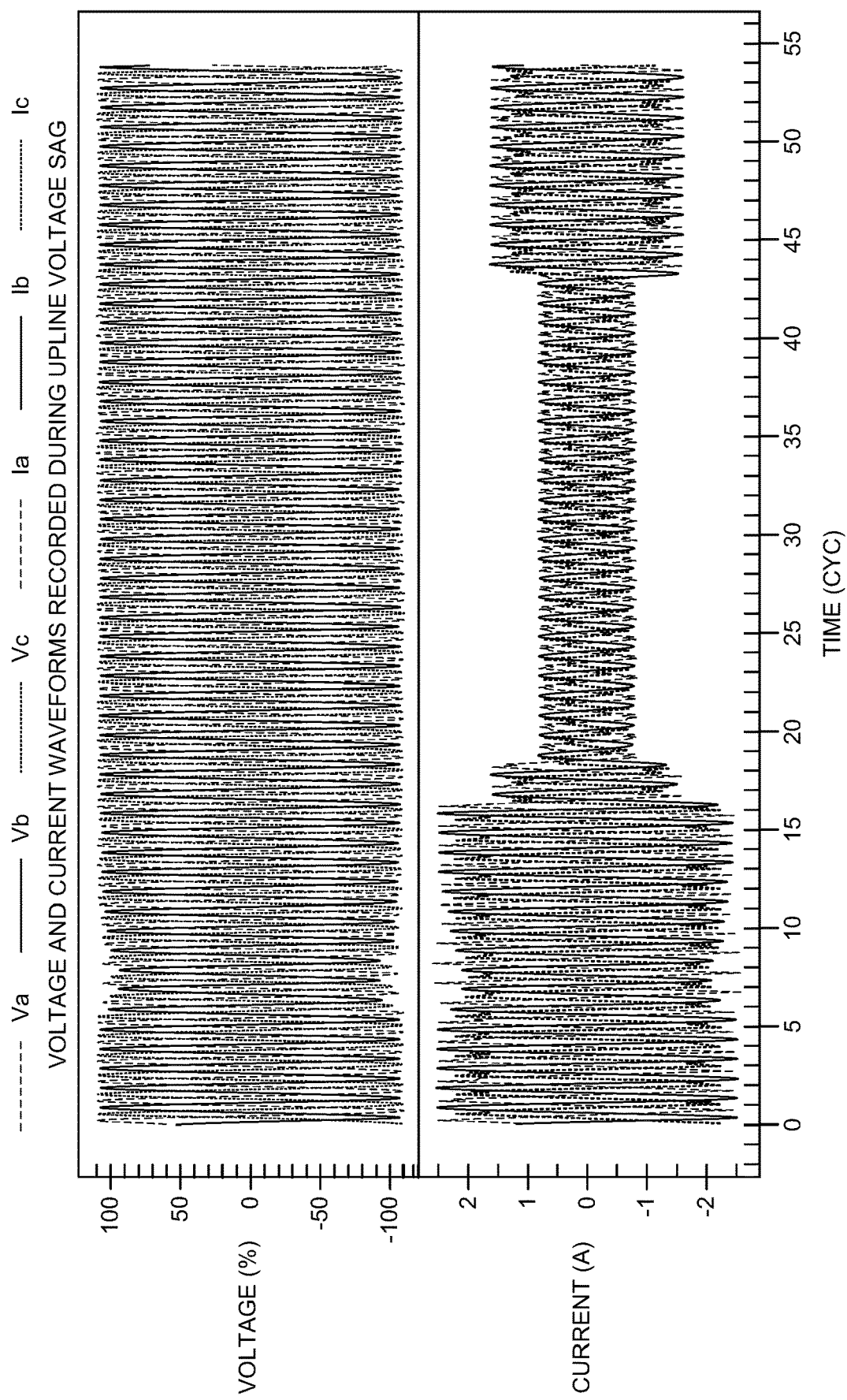
FIG. 9 shows example voltage and current waveforms recorded during an upline voltage sag.

As used herein, the term "voltage sags due to upline electrical system disturbances" is used to describe momentary reductions in voltage caused by electrical short circuits or large load start-up that is upline (towards the electrical source) of the electrical monitoring location. Example voltage sags due to upline electrical system disturbances are shown in FIG. 9, for example, as discussed further below.

Figure 7:
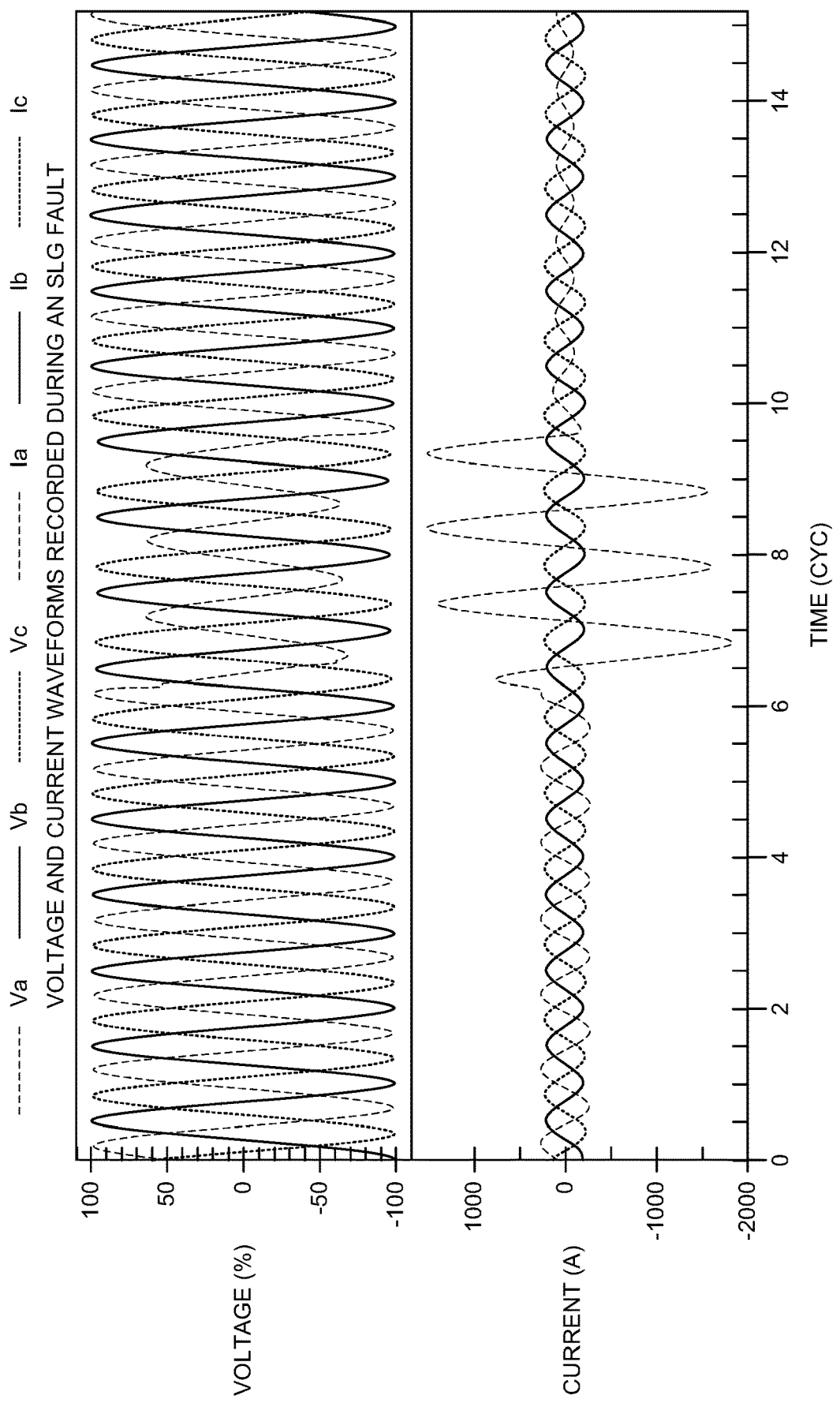
FIG. 7 shows example voltage and current waveforms recorded during a single-phase fault event.
Figure 8:
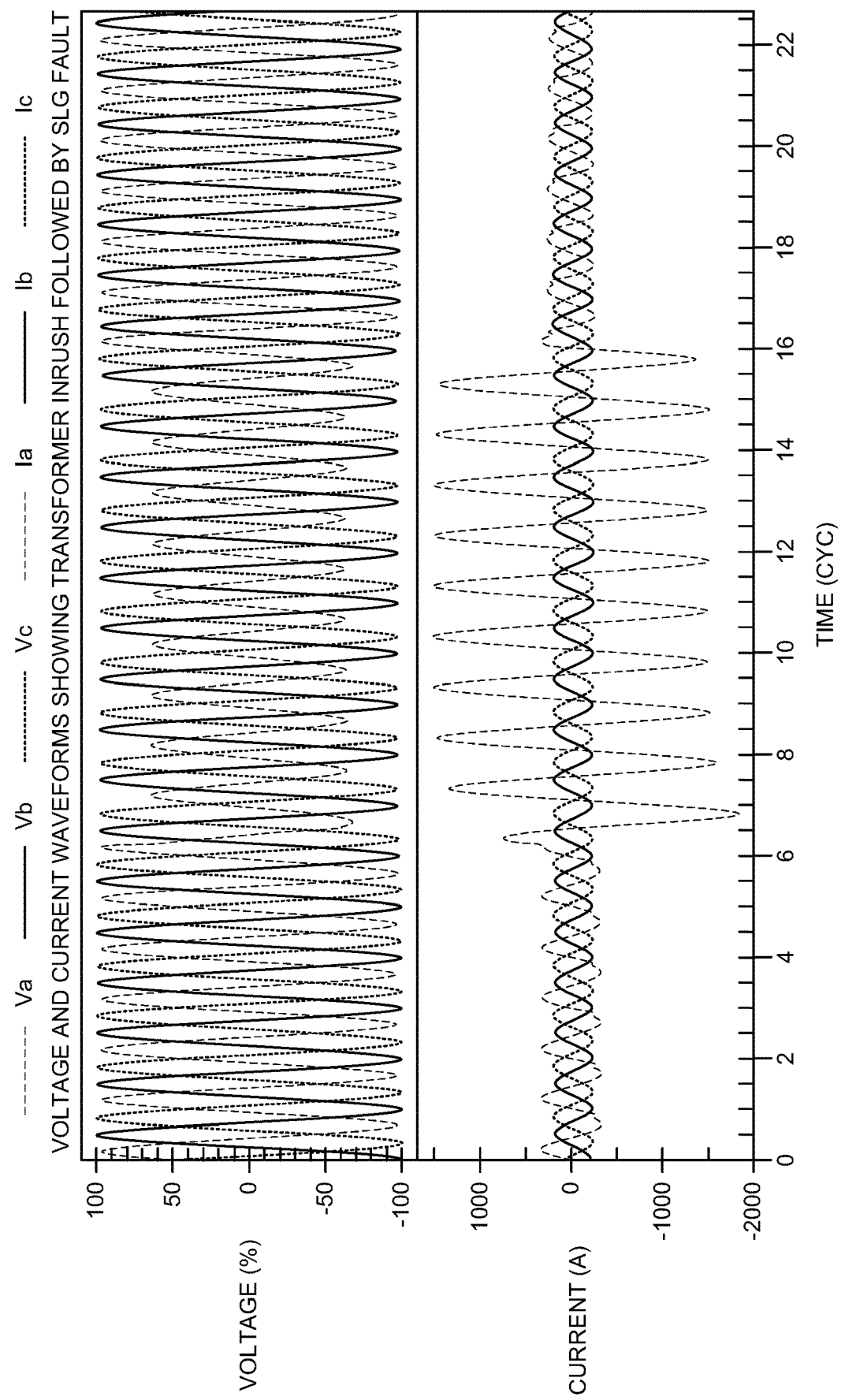
FIG. 8 shows example voltage and current waveforms recorded during a transformer inrush followed by a single-phase fault.

As used herein, the term "voltage sags due to downline electrical system faults" is used to describe momentary voltage reductions caused by an increase in current from an electrical system fault, which is caused by an unintended connection of the electrical circuit to ground caused by lightning, insulator failure, equipment failure, interference from trees or automobiles, vandalism, fires, etc. The larger current during the fault causes in a larger voltage drop across the impedance of the conductors supplying a load, resulting in lower than expected voltage. Example voltage sags due to downline electrical system faults are shown in FIGS. 7 and 8, for example, as discussed further below.

Figure 5:
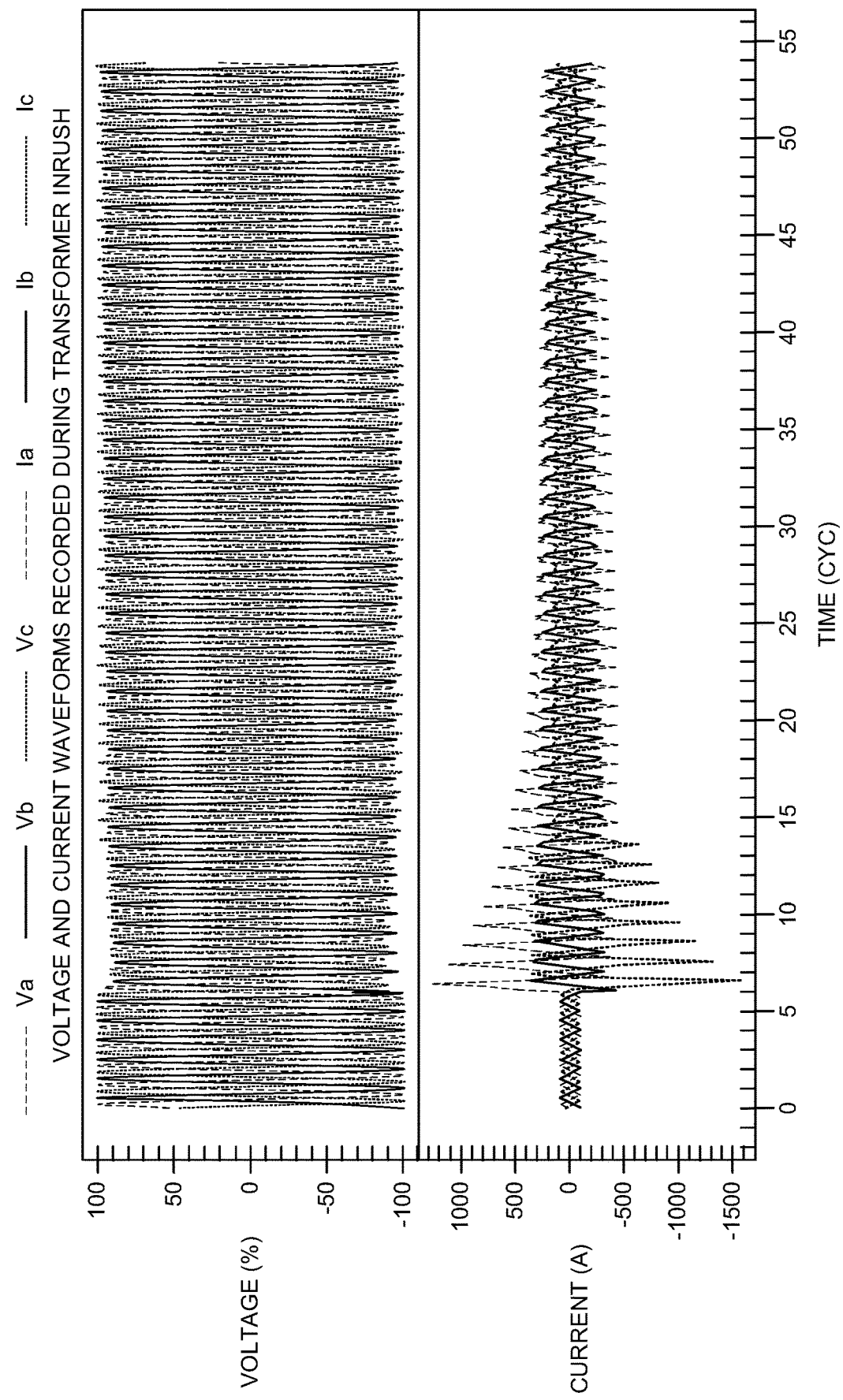
FIG. 5 shows example voltage and current waveforms recorded during a transformer inrush.
Figure 6:
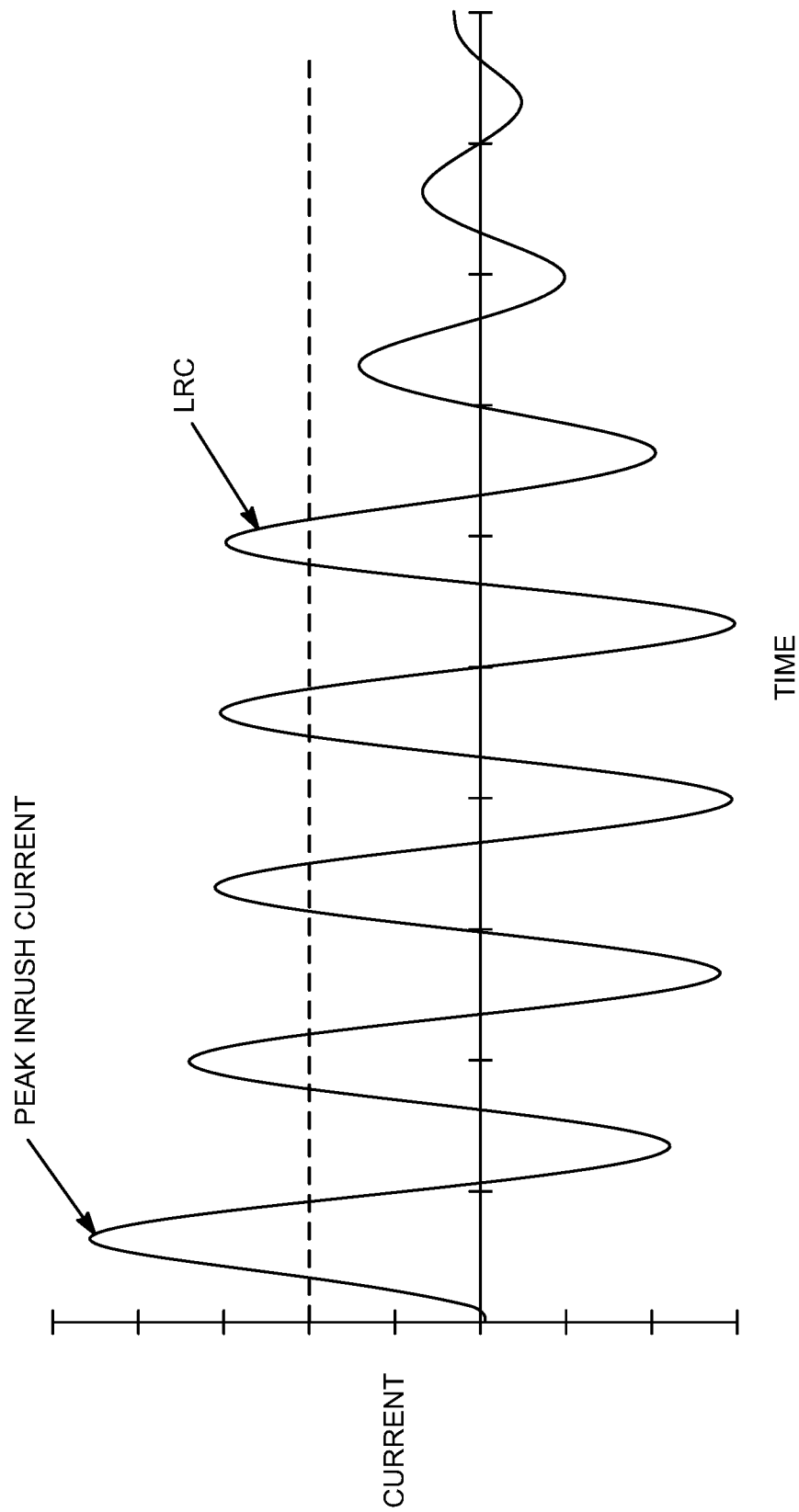
FIG. 6 shows an example current waveform recorded during a motor inrush.

As used herein, the term "voltage sags due to downline transformer and/or motor magnetization" is used to describe momentary voltage reductions caused by an increase in current from the normal energizing of a power transformer or the normal magnetizing of an AC induction motor. During energizing or startup, these loads will draw large harmonic-rich waveforms of current. The larger current during energizing causes a larger voltage drop across the impedance of the conductors supplying a load, resulting in lower than expected voltage. Example voltage sags due to downline transformer and/or motor magnetization are shown in FIGS. 5 and 6, for example, as discussed further below.

Figure 10:
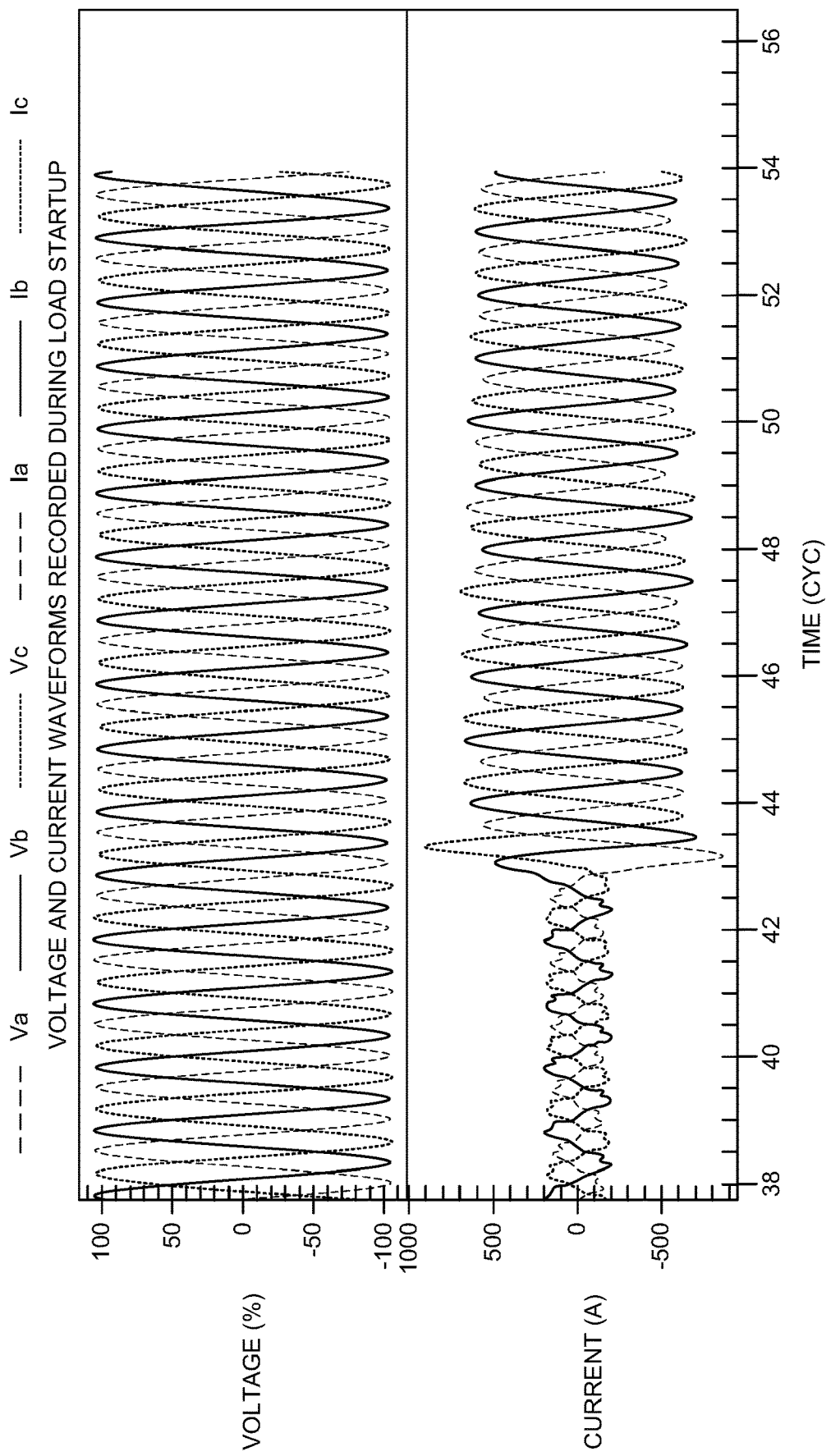
FIG. 10 shows example voltage and current waveforms recorded during a load startup.
Figure 11:
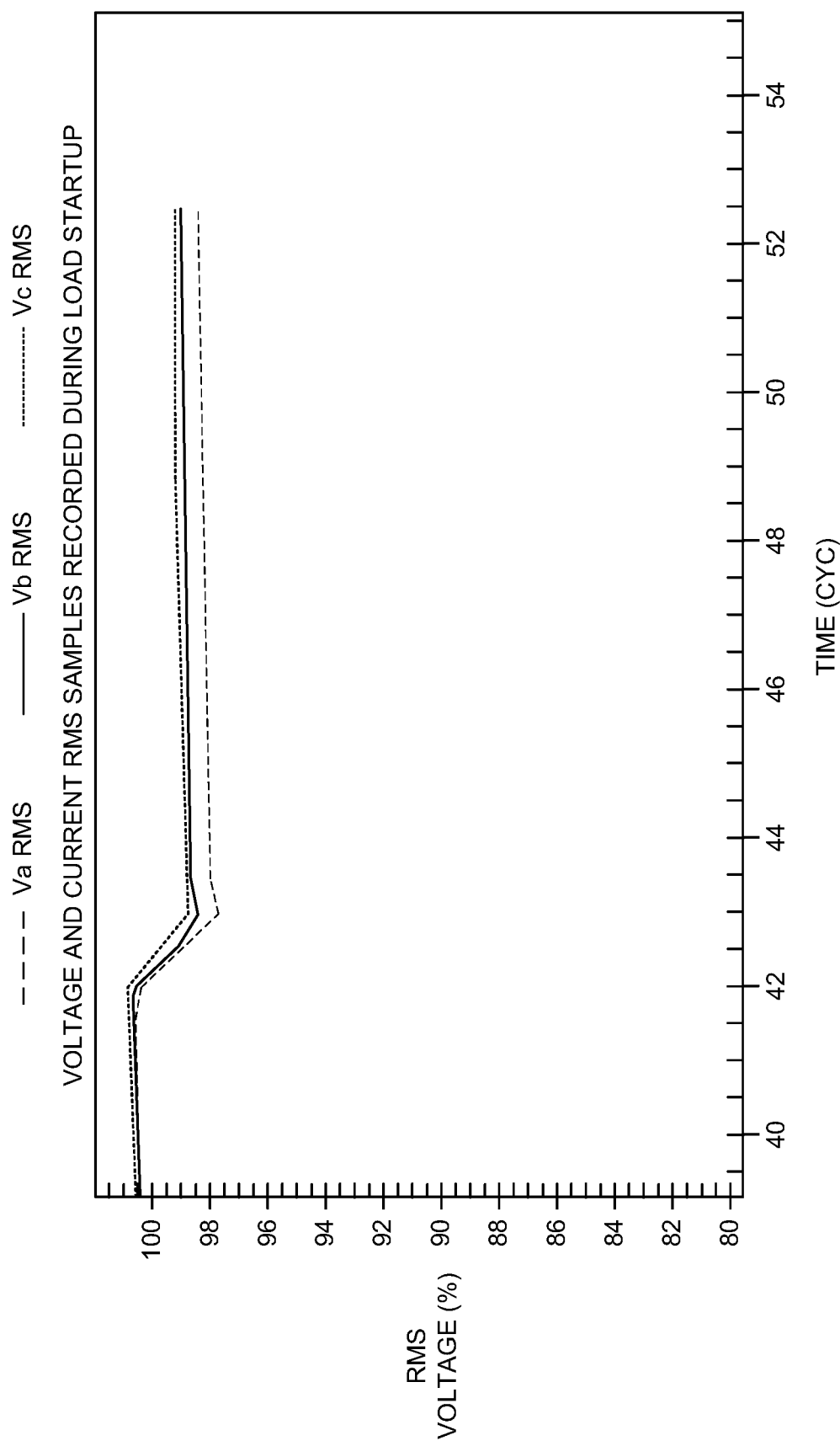
FIG. 11 shows example voltage and current root-mean-square (rms) samples recorded during a load startup.

As used herein, the term "voltage sags due to other downline disturbances" is used to describe momentary reductions in voltage, for example, due to the startup of lighting, heating, other motors, appliances, power supplies, and more. Example voltage sags due to other downline disturbances are shown in FIGS. 10 and 11, for example, as discussed further below. It is understood that this categorization may additionally or alternatively include voltage sags associated with normal operation. Additionally, it is understood that this categorization, and other categorizations described herein, apply to single and/or multi-phase electrical systems.

In embodiments, the degree of impact a short-duration rms variation has on an energy consumer's facility, for example, is primarily dependent on four factors:

1. The nature and source of the event,
2. The susceptibility of the load(s) to the event,
3. The event's influence on the process or activity, and
4. The cost sensitivity to this event.

Consequently, each customer system, operation or load may respond differently to a given electrical perturbation. For example, it is possible for a voltage sag event to significantly impact one customer's operation while the same voltage sag may have little or no noticeable impact on another customer's operation. It is also possible for a voltage sag to impact one part of a customer's electrical system differently than it does another part of the same electrical system.

Figure 1:
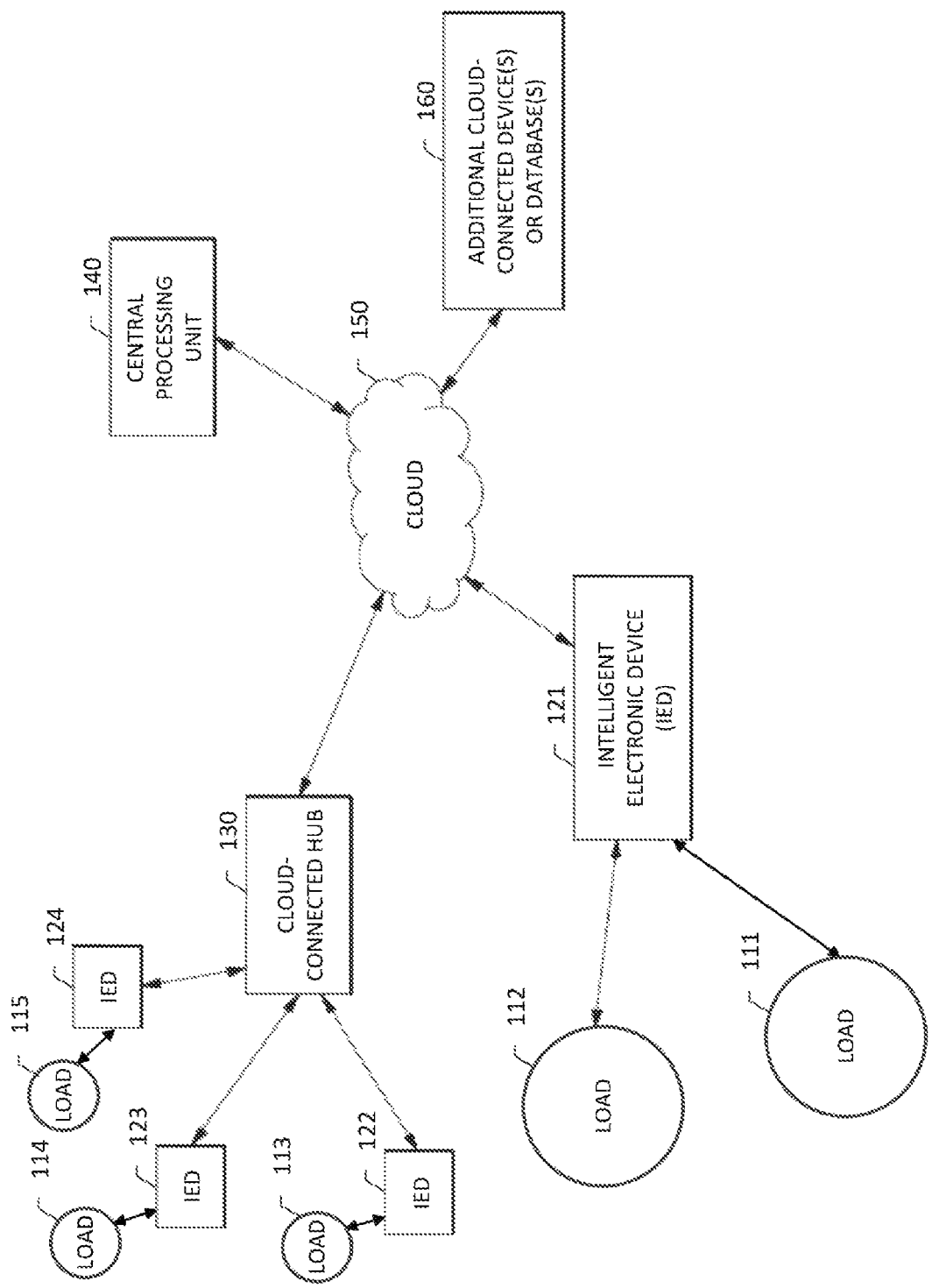
FIG. 1 shows an example electrical system in accordance with embodiments of the disclosure.

Referring to FIG. 1, an example electrical system in accordance with embodiments of the disclosure includes one or more loads (here, loads 111, 112, 113, 114, 115) and one or more intelligent electronic devices (IEDs) (here, IEDs 121, 122, 123, 124) capable of sampling, sensing or monitoring one or more parameters (e.g., power monitoring parameters) associated with the loads. In embodiments, the loads 111, 112, 113, 114, 115 and IEDs 121, 122, 123, 124 may be installed in one or more buildings or other physical locations or they may be installed on one or more processes and/or loads within a building. The buildings may correspond, for example, to commercial, industrial or institutional buildings.

As shown in FIG. 1, the IEDs 121, 122, 123, 124 are each coupled to one or more of the loads 111, 112, 113, 114, 115 (which may be located "upline" or "downline" from the IEDs in some embodiments). The loads 111, 112, 113, 114, 115 may include, for example, machinery or apparatuses associated with a particular application (e.g., an industrial application), applications, and/or process(es). The machinery may include electrical or electronic equipment, for example. The machinery may also include the controls and/or ancillary equipment associated with the equipment.

In embodiments, the IEDs 121, 122, 123, 124 may monitor and, in some embodiments, analyze parameters (e.g., energy-related parameters) associated with the loads 111, 112, 113, 114, 115 to which they are coupled. The IEDs 121, 122, 123, 124 may also be embedded within the loads 111, 112, 113, 114, 115 in some embodiments. According to various aspects, one or more of the IEDs 121, 122, 123, 124 may be configured to monitor utility feeds, including surge protective devices (SPDs), trip units, active filters, lighting, IT equipment, motors, and/or transformers, which are some examples of loads 111, 112, 113, 114, 115, and the IEDs 121, 122, 123, 124 may detect ground faults, voltage sags, voltage swells, momentary interruptions and oscillatory transients, as well as fan failure, temperature, arcing faults, phase-to-phase faults, shorted windings, blown fuses, and harmonic distortions, which are some example parameters that may be associated with the loads 111, 112, 113, 114, 115. The IEDs 121, 122, 123, 124 may also monitor devices, such as generators, including input/outputs (I/Os), protective relays, battery chargers, and sensors (for example, water, air, gas, steam, levels, accelerometers, flow rates, pressures, and so forth).

According to another aspect, the IEDs 121, 122, 123, 124 may detect overvoltage and undervoltage conditions, as well as other parameters such as temperature, including ambient temperature. According to a further aspect, the IEDs 121, 122, 123, 124 may provide indications of monitored parameters and detected conditions that can be used to control the loads 111, 112, 113, 114, 115 and other equipment in the electrical system in which the loads 111, 112, 113, 114 and IEDs 121, 122, 123, 124 are installed. A wide variety of other monitoring and/or control functions can be performed by the IEDs 121, 122, 123, 124, and the aspects and embodiments disclosed herein are not limited to IEDs 121, 122, 123, 124 operating according to the above-mentioned examples.

It is understood that the IEDs 121, 122, 123, 124 may take various forms and may each have an associated complexity (or set of functional capabilities and/or features). For example, IED 121 may correspond to a "basic" IED, IED 122 may correspond to an "intermediate" IED, and IED 123 may correspond to an "advanced" IED. In such embodiments, intermediate IED 122 may have more functionality (e.g., energy measurement features and/or capabilities) than basic IED 121, and advanced IED 123 may have more functionality and/or features than intermediate IED 122. For example, in embodiments IED 121 (e.g., an IED with basic capabilities and/or features) may be capable of monitoring instantaneous voltage, current energy, demand, power factor, averages values, maximum values, instantaneous power, and/or long-duration rms variations, and IED 123 (e.g., an IED with advanced capabilities) may be capable of monitoring additional parameters such as voltage transients, voltage fluctuations, frequency slew rates, harmonic power flows, and discrete harmonic components, all at higher sample rates, etc. It is understood that this example is for illustrative purposes only, and likewise in some embodiments an IED with basic capabilities may be capable of monitoring one or more of the above energy measurement parameters that are indicated as being associated with an IED with advanced capabilities. It is also understood that in some embodiments the IEDs 121, 122, 123, 124 each have independent functionality.

In the example embodiment shown, the IEDs 121, 122, 123, 124 are communicatively coupled to a central processing unit 140 via the "cloud" 150. In some embodiments, the IEDs 121, 122, 123, 124 may be directly communicatively coupled to the cloud 150, as IED 121 is in the illustrated embodiment. In other embodiments, the IEDs 121, 122, 123, 124 may be indirectly communicatively coupled to the cloud 150, for example, through an intermediate device, such as a cloud-connected hub 130 (or a gateway), as IEDs 122, 123, 124 are in the illustrated embodiment. The cloud-connected hub 130 (or the gateway) may, for example, provide the IEDs 122, 123, 124 with access to the cloud 150 and the central processing unit 140.

As used herein, the terms "cloud" and "cloud computing" are intended to refer to computing resources connected to the Internet or otherwise accessible to IEDs 121, 122, 123, 124 via a communication network, which may be a wired or wireless network, or a combination of both. The computing resources comprising the cloud 150 may be centralized in a single location, distributed throughout multiple locations, or a combination of both. A cloud computing system may divide computing tasks amongst multiple racks, blades, processors, cores, controllers, nodes or other computational units in accordance with a particular cloud system architecture or programming. Similarly, a cloud computing system may store instructions and computational information in a centralized memory or storage, or may distribute such information amongst multiple storage or memory components. The cloud system may store multiple copies of instructions and computational information in redundant storage units, such as a RAID array.

The central processing unit 140 may be an example of a cloud computing system, or cloud-connected computing system. In embodiments, the central processing unit 140 may be a server located within buildings in which the loads 111, 112, 113, 114, 115, and the IEDs 121, 122, 123, 124 are installed, or may be remotely-located cloud-based service. The central processing unit 140 may include computing functional components similar to those of the IEDs 121, 122, 123, 124 is some embodiments, but may generally possess greater numbers and/or more powerful versions of components involved in data processing, such as processors, memory, storage, interconnection mechanisms, etc. The central processing unit 140 can be configured to implement a variety of analysis techniques to identify patterns in received measurement data from the IEDs 121, 122, 123, 124, as discussed further below. The various analysis techniques discussed herein further involve the execution of one or more software functions, algorithms, instructions, applications, and parameters, which are stored on one or more sources of memory communicatively coupled to the central processing unit 140. In certain embodiments, the terms "function", "algorithm", "instruction", "application", or "parameter" may also refer to a hierarchy of functions, algorithms, instructions, applications, or parameters, respectively, operating in parallel and/or tandem. A hierarchy may comprise a tree-based hierarchy, such a binary tree, a tree having one or more child nodes descending from each parent node, or combinations thereof, wherein each node represents a specific function, algorithm, instruction, application, or parameter.

In embodiments, since the central processing unit 140 is connected to the cloud 150, it may access additional cloud-connected devices or databases 160 via the cloud 150. For example, the central processing unit 140 may access the Internet and receive information such as weather data, utility pricing data, or other data that may be useful in analyzing the measurement data received from the IEDs 121, 122, 123, 124. In embodiments, the cloud-connected devices or databases 160 may correspond to a device or database associated with one or more external data sources. Additionally, in embodiments, the cloud-connected devices or databases 160 may correspond to a user device from which a user may provide user input data. A user may view information about the IEDs 121, 122, 123, 124 (e.g., IED makes, models, types, etc.) and data collected by the IEDs 121, 122, 123, 124 (e.g., energy usage statistics) using the user device. Additionally, in embodiments the user may configure the IEDs 121, 122, 123, 124 using the user device.

In embodiments, by leveraging the cloud-connectivity and enhanced computing resources of the central processing unit 140 relative to the IEDs 121, 122, 123, 124, sophisticated analysis can be performed on data retrieved from one or more IEDs 121, 122, 123, 124, as well as on the additional sources of data discussed above, when appropriate. This analysis can be used to dynamically control one or more parameters, processes, conditions or equipment (e.g., loads) associated with the electrical system.

In embodiments, the parameters, processes, conditions or equipment are dynamically controlled by a control system associated with the electrical system. In embodiments, the control system may correspond to or include one or more of the IEDs 121, 122, 123, 124 in the electrical system, central processing unit 140 and/or other devices within or external to the electrical system.

Figure 2:
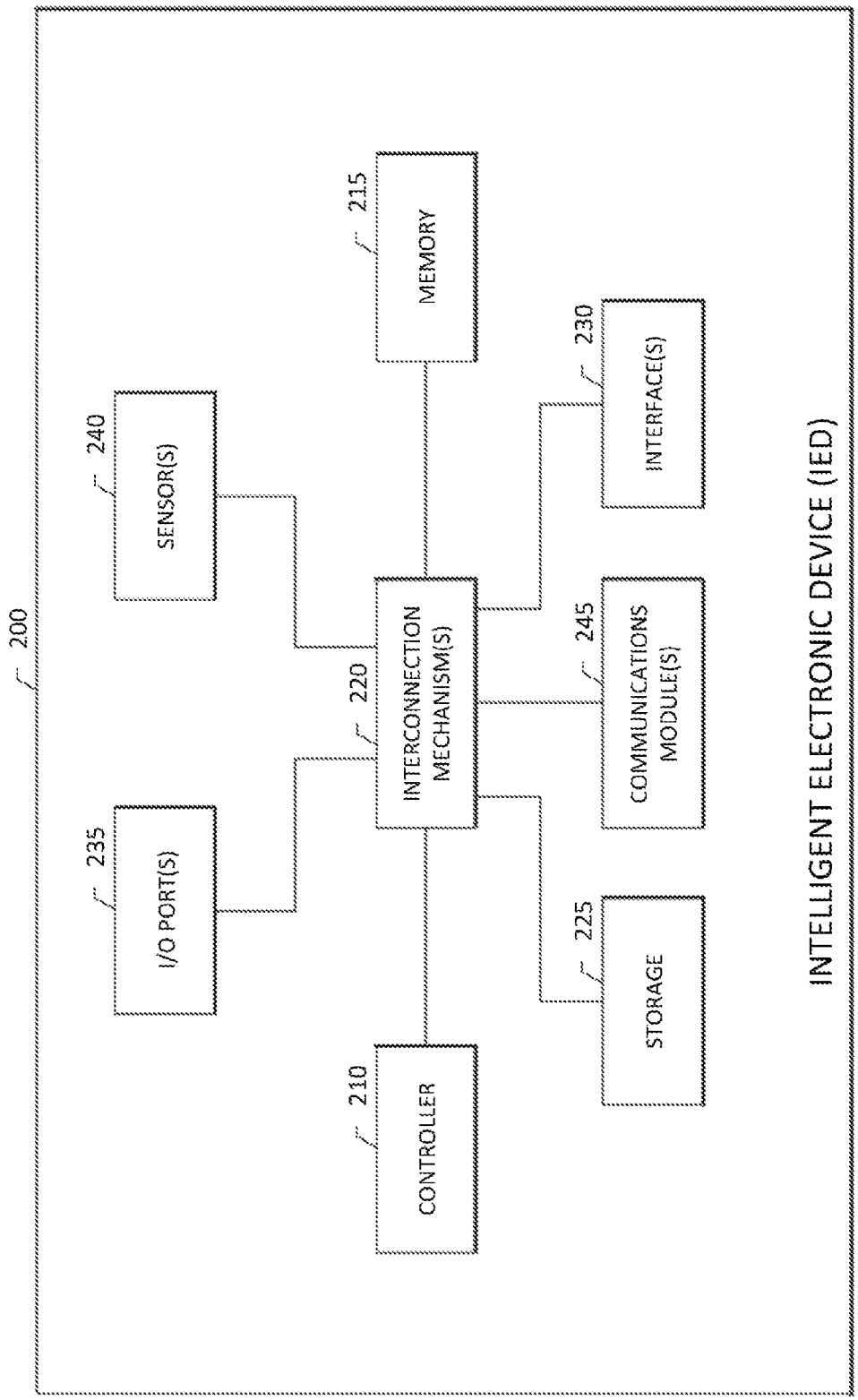
FIG. 2 shows an example intelligent electronic device (IED) that may be used in an electrical system in accordance with embodiments of the disclosure.

Referring to FIG. 2, an example IED 200 that may be suitable for use in the electrical system shown in FIG. 1, for example, includes a controller 210, a memory device 215, storage 225, and an interface 230. The IED 200 also includes an input-output (I/O) port 235, a sensor 240, a communication module 245, and an interconnection mechanism 220 for communicatively coupling two or more IED components 210-245.

The memory device 215 may include volatile memory, such as DRAM or SRAM, for example. The memory device 215 may store programs and data collected during operation of the IED 200. For example, in embodiments in which the IED 200 is configured to monitor or measure one or more electrical parameters associated with one or more loads (e.g., 111, shown in FIG. 1) in an electrical system, the memory device 215 may store the monitored electrical parameters.

The storage system 225 may include a computer readable and writeable nonvolatile recording medium, such as a disk or flash memory, in which signals are stored that define a program to be executed by the controller 210 or information to be processed by the program. The controller 210 may control transfer of data between the storage system 225 and the memory device 215 in accordance with known computing and data transfer mechanisms. In embodiments, the electrical parameters monitored or measured by the IED 200 may be stored in the storage system 225.

The I/O port 235 can be used to couple loads (e.g., 111, shown in FIG. 1) to the IED 200, and the sensor 240 can be used to monitor or measure the electrical parameters associated with the loads. The I/O port 235 can also be used to coupled external devices, such as sensor devices (e.g., temperature and/or motion sensor devices) and/or user input devices (e.g., local or remote computing devices) (not shown), to the IED 200. The external devices may be local or remote devices, for example, a gateway (or gateways). The I/O port 235 may further be coupled to one or more user input/output mechanisms, such as buttons, displays, acoustic devices, etc., to provide alerts (e.g., to display a visual alert, such as text and/or a steady or flashing light, or to provide an audio alert, such as a beep or prolonged sound) and/or to allow user interaction with the IED 200.

The communication module 245 may be configured to couple the IED 200 to one or more external communication networks or devices. These networks may be private networks within a building in which the IED 200 is installed, or public networks, such as the Internet. In embodiments, the communication module 245 may also be configured to couple the IED 200 to a cloud-connected hub (e.g., 130, shown in FIG. 1), or to a cloud-connected central processing unit (e.g., 140, shown in FIG. 1), associated with an electrical system including IED 200.

The IED controller 210 may include one or more processors that are configured to perform specified function(s) of the IED 200. The processor(s) can be a commercially available processor, such as the well-known Pentium™, Core™, or Atom™ class processors available from the Intel Corporation. Many other processors are available, including programmable logic controllers. The IED controller 210 can execute an operating system to define a computing platform on which application(s) associated with the IED 200 can run.

In embodiments, the electrical parameters monitored or measured by the IED 200 may be received at an input of the controller 210 as IED input data, and the controller 210 may process the measured electrical parameters to generate IED output data or signals at an output thereof. In embodiments, the IED output data or signals may correspond to an output of the IED 200. The IED output data or signals may be provided at I/O port(s) 235, for example. In embodiments, the IED output data or signals may be received by a cloud-connected central processing unit, for example, for further processing (e.g., to identify power quality events, as briefly discussed above), and/or by equipment (e.g., loads) to which the IED is coupled (e.g., for controlling one or more parameters associated with the equipment, as will be discussed further below). In one example, the IED 200 may include an interface 230 for displaying visualizations indicative of the IED output data or signals. The interface 230 may correspond to a graphical user interface (GUI) in embodiments.

Components of the IED 200 may be coupled together by the interconnection mechanism 220, which may include one or more busses, wiring, or other electrical connection apparatus. The interconnection mechanism 220 may enable communications (e.g., data, instructions, etc.) to be exchanged between system components of the IED 200.

It is understood that IED 200 is but one of many potential configurations of IEDs in accordance with various aspects of the disclosure. For example, IEDs in accordance with embodiments of the disclosure may include more (or fewer) components than IED 200. Additionally, in embodiments one or more components of IED 200 may be combined. For example, in embodiments memory 215 and storage 225 may be combined.

Returning now to FIG. 1, in order to accurately describe aperiodic events such as voltage sags in an electrical system (such as the electric system shown in FIG. 1), it is important to measure the energy-related waveforms associated with the event. Two attributes often used to characterize voltage sags and transients are magnitude (deviation from the norm) and duration (length in time) of the event. Both parameters are instrumental in defining, and thus, identifying and mitigating these types of power quality issues.

The systems and methods disclosed herein classify measurements with energy-related waveforms into a plurality of categories, for example: (1) voltage sags due to upline electrical system disturbances, (2) voltage sags due to downline electric electrical system faults (that is, electrical system short circuits), (3) voltage sags due to downline transformer and/or motor magnetization, and (4) voltage sags due to other downline load disturbances that do not include fault or inrush characteristics. More particularly, in some implementations, the disclosed systems and methods categorize each sample of a waveform into the plurality of categories and categorize the complete waveform measurement into one or more of the plurality of categories. As noted above in the Summary Section of this disclosure, the energy-related waveform(s) may include at least one of: voltage waveform(s), current waveform(s), power waveform(s), derivatives of voltage, current and/or power waveforms, integrals of voltage, current and/or power waveforms, and any (or substantially any) other energy-related waveforms derived from voltage and/or current signatures.

The disclosed systems and methods may be embedded (or otherwise implemented) in Schneider Electric ION meters and Schneider Electric microprocessor relays, for example. This would allow the monitoring devices to output signals or alarms related to detection of faults, inrush, or other downline load disturbance. This would supplement other analysis features related to voltage sags, including the Schneider Electric algorithm related to loss of electrical load due to voltage sags described in co-pending U.S. patent application Ser. No. 16/233,231, entitled "Systems and Methods for Managing Voltage Event Alarms in an Electrical System", which application is assigned to the same assignee as the present disclosure. It is understood that the disclosed systems and methods may also be found suitable in a number of other meters, microprocessor relays, and similar devices.

The disclosed systems and methods may also be incorporated into edge software to divide/categorize voltage sags into a plurality of categories (such as those noted above). These categorizations could result in new email notifications or alarms not available in current monitoring instruments or software. The measurements including the energy-related waveforms could be filtered or grouped by voltage sag cause types automatically.

The disclosed systems and methods may further be into the cloud-based software (such as EcoStruxure™ Power Advisor by Schneider Electric). One example application is having Power Advisor track repetitive momentary faults and provide warnings when the same momentary fault has been detected more than once in a short period of time without a subsequent permanent fault.

In accordance with embodiments of this disclosure, the disclosed systems and methods operate (at least partially) on energy-related waveforms recorded by any of the above described devices or instruments (e.g., electric power meter or a microprocessor relay). In some embodiments, the energy-related waveforms are triggered using a voltage sag detection algorithm, for example, which may be already available (or could be made available) within the devices or instruments.

In some embodiments, the measurements include at least a full cycle of pre-sag energy-related samples, which allows the systems and methods to establish the initial conditions before the voltage sag occurred. The disclosed systems and methods may process the waveform's instantaneous voltage and current quantities, but may also compute rms quantities, fundamental phasor quantities, and quantities for at least one harmonic and/or interharmonic frequency. Together, these measured and derived quantities may be used to classify each waveform sample of the voltage sag into one of a plurality of categories, for example: upline voltage sag, downline fault, downline inrush, or other downline disturbance. As electrical system disturbances can evolve through these categories, the disclosed systems and methods may allow the complete measurement to have more than one categorization. For example, a voltage sag measurement may begin as a transformer or motor inrush but could end as a fault event.

The output of the invention's algorithm will be voltage sag categories (and, in some cases, other categories) that deduce the source of a disturbance, for example, an upline voltage sag, a downline fault, a downline inrush, or other downline load disturbance. These categories can be used in meter notifications, edge software alerts and voltage sag event list filtering or grouping, and cloud software analytics for trends in sources of voltage sags, for example.

Figure 3:
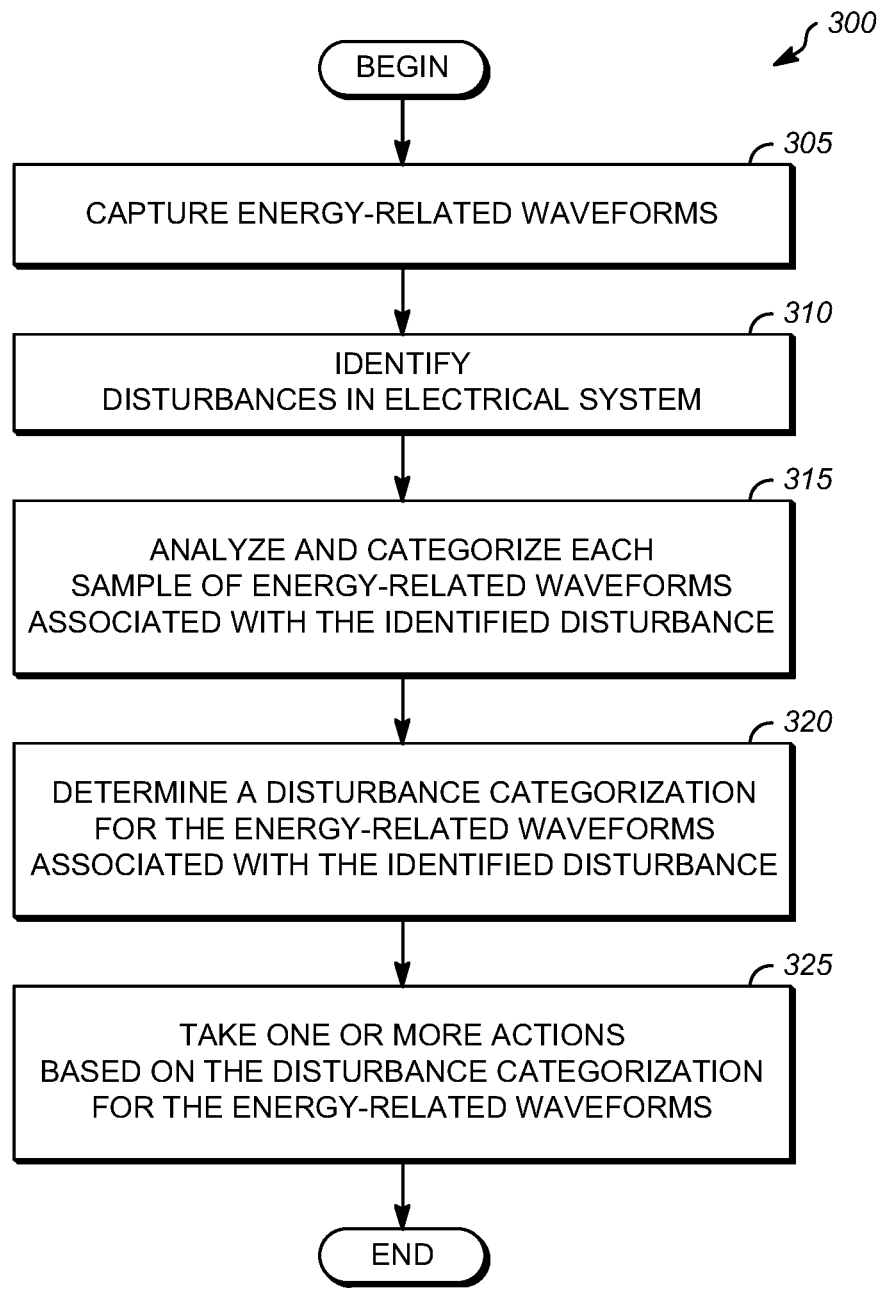
FIG. 3 is a flowchart illustrating an example method for automatically categorizing disturbances in an electrical system in accordance with embodiments of the disclosure.
Figure 4:
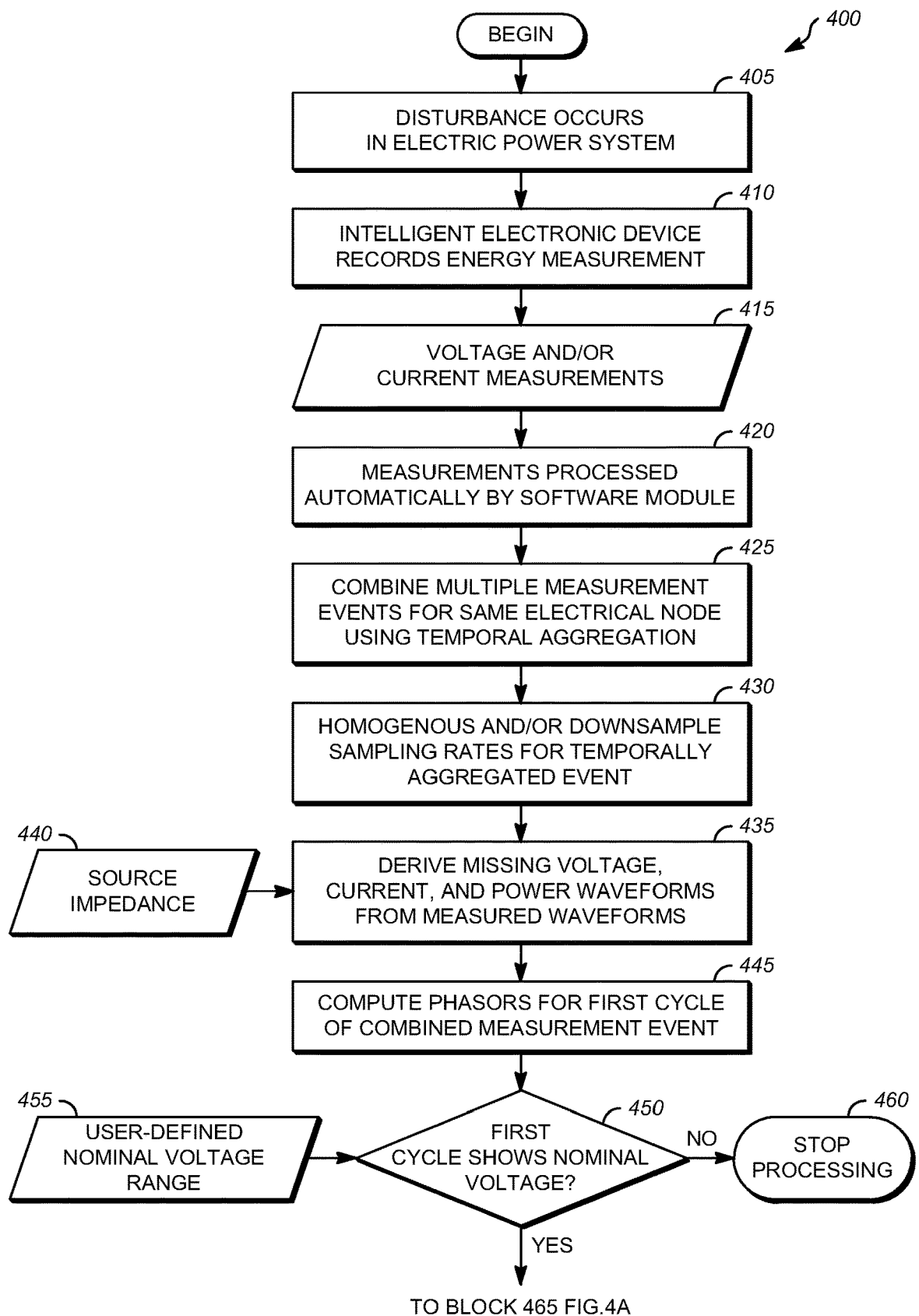
FIGS. 4-4C are flowcharts illustrating another example method for automatically categorizing disturbances in an electrical system in accordance with embodiments of the disclosure.
Figure 4A:
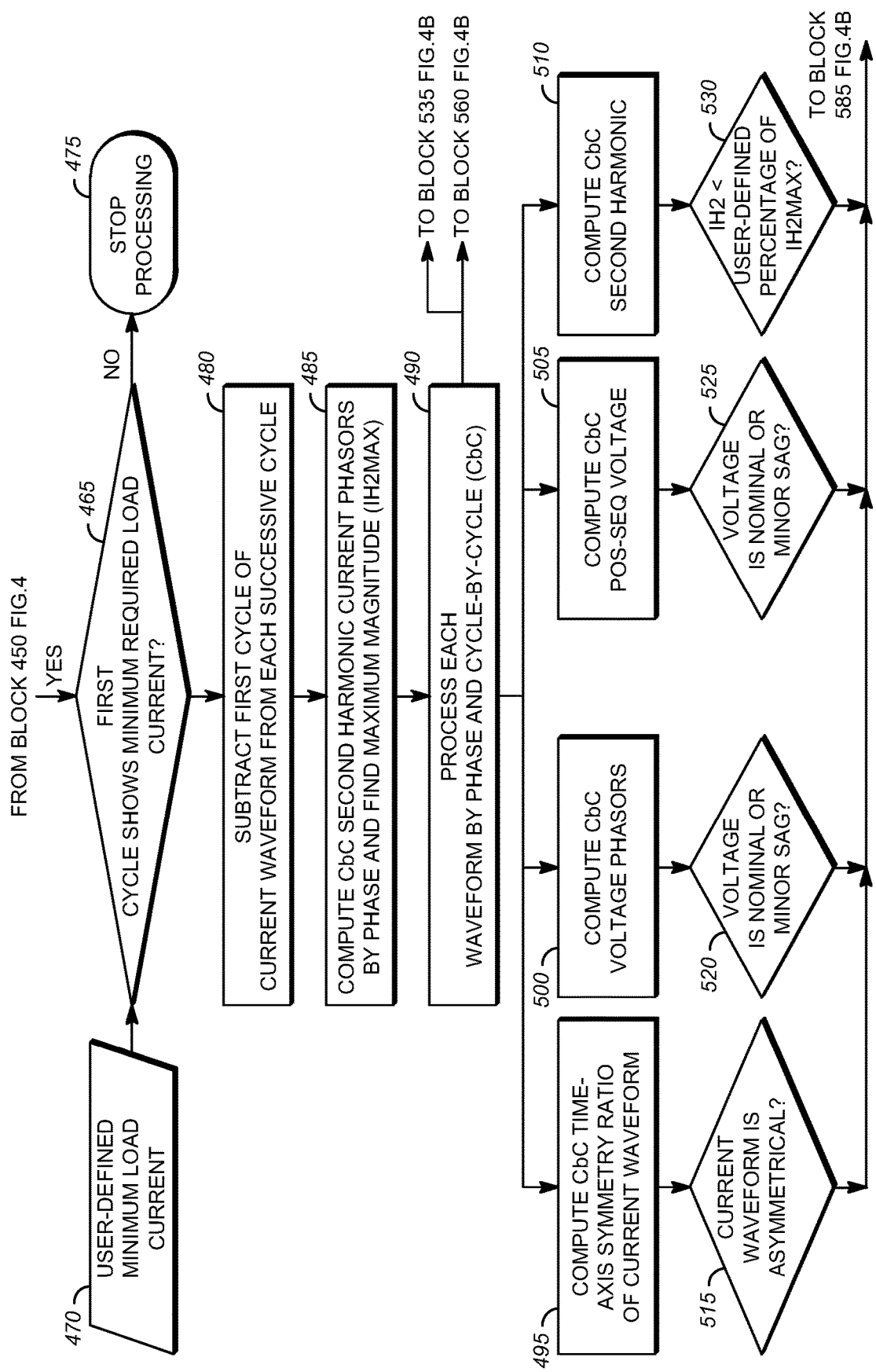
Figure 4B:
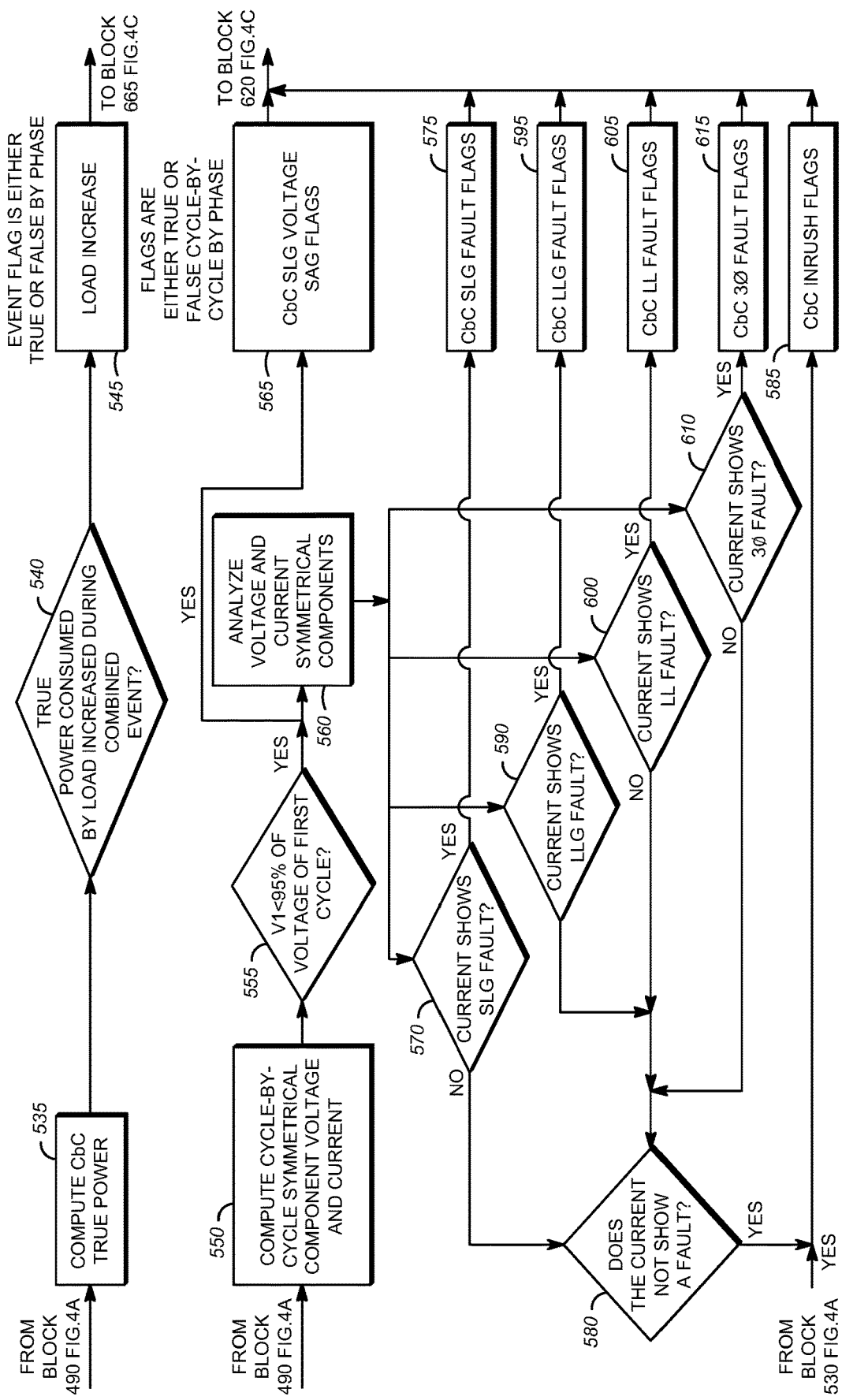
Figure 4C:
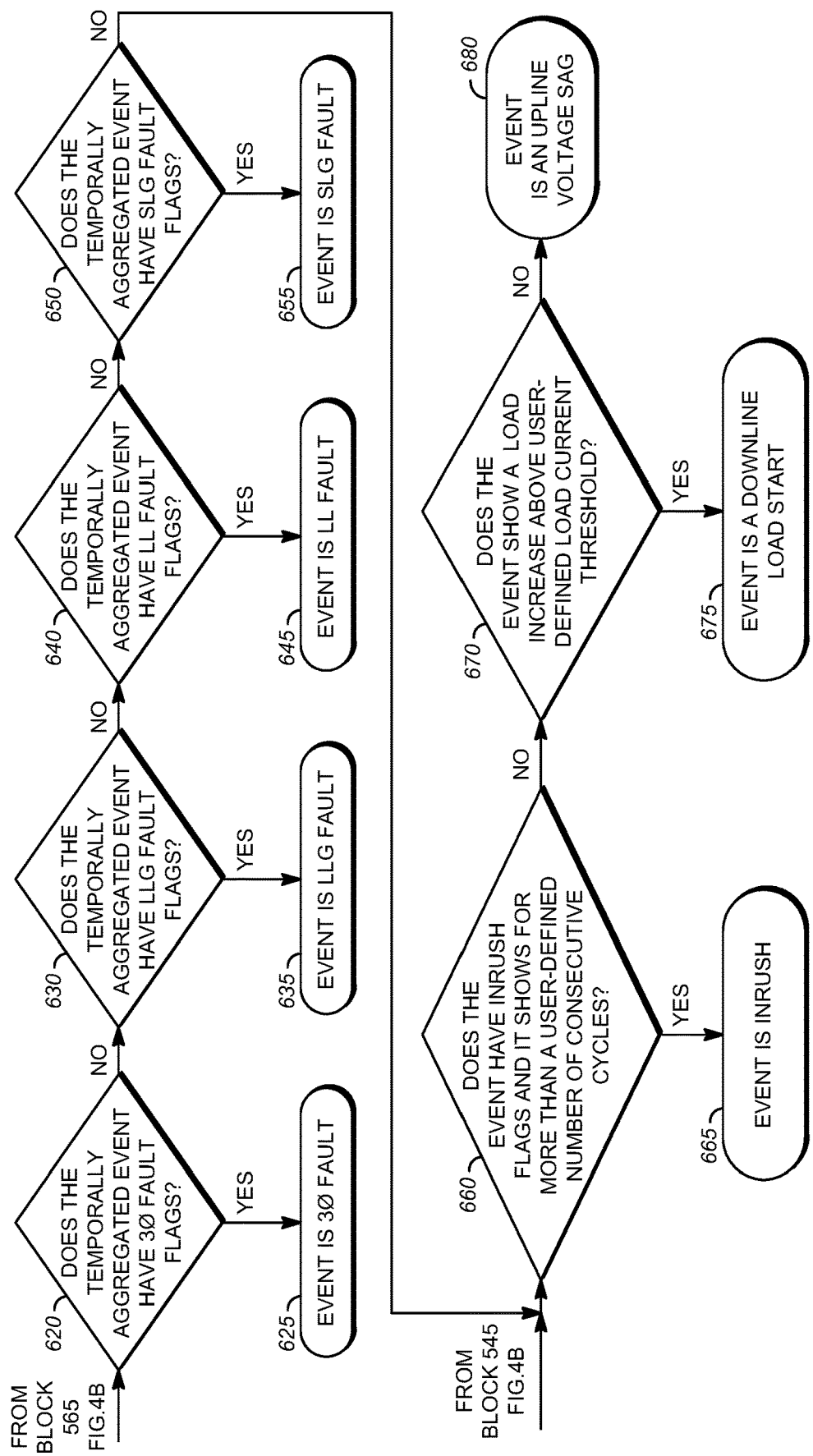

Referring to FIGS. 3-4C, several flowcharts (or flow diagrams) are shown to illustrate various methods (here, methods 300, 400) of the disclosure for automatically categorizing disturbances in an electrical system. Rectangular elements (typified by element 405 in FIG. 4), as may be referred to herein as "processing blocks," may represent computer software and/or IED algorithm instructions or groups of instructions. Diamond shaped elements (typified by element 455 in FIG. 4), as may be referred to herein as "decision blocks," represent computer software and/or IED algorithm instructions, or groups of instructions, which affect the execution of the computer software and/or IED algorithm instructions represented by the processing blocks. The processing blocks and decision blocks (and other blocks shown) can represent steps performed by functionally equivalent circuits such as a digital signal processor circuit or an application specific integrated circuit (ASIC).

The flowcharts do not depict the syntax of any particular programming language. Rather, the flowcharts illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied. Thus, unless otherwise stated, the blocks described below are unordered; meaning that, when possible, the blocks can be performed in any convenient or desirable order including that sequential blocks can be performed simultaneously and vice versa. It will also be understood that various features from the flowcharts described below may be combined in some embodiments. Thus, unless otherwise stated, features from one of the flowcharts described below may be combined with features of other ones of the flowcharts described below, for example, to capture the various advantages and aspects of systems and methods associated with automatically categorizing disturbances in an electrical system sought to be protected by this disclosure. It is also understood that various features from the flowcharts described below may be separated in some embodiments. For example, while the flowcharts shown in FIGS. 4-4C are shown having many blocks, in some embodiments the illustrated method shown by these flowcharts may include fewer blocks or steps.

Referring to FIG. 3, a flowchart illustrates an example method 300 for automatically categorizing disturbances in an electrical system. Method 300 may be implemented, for example, on a processor of at least one IED (e.g., 121, shown in FIG. 1) and/or remote from the at least IED, for example, in at least one of: a cloud-based system, on-site software, a gateway, or another head-end system.

As illustrated in FIG. 3, the method 300 begins at block 305, where energy-related waveforms are captured by at least one IED in the electrical system. The at least one IED may be installed or located, for example, at a respective metering point of a plurality of metering points in the electrical system. The energy-related waveform(s) may include at least one of: voltage waveform(s), current waveform(s), power waveform(s), derivatives of voltage, current and/or power waveforms, integrals of voltage, current and/or power waveforms, and any (or substantially any) other energy-related waveform derived from the voltage and/or current signatures. The voltage and/or current waveforms may, for example, be single-phase or three-phase voltage and current waveforms. These waveforms may be sampled at a variety of rates, for example, a rate of 100 Hz or above.

At block 310, electrical measurement data from, or derived from, the energy-related waveforms is processed to identify disturbances (e.g., electrical disturbances) in the electrical system. In accordance with some embodiments of this disclosure, the disturbances are identified based on one or more characteristics of the energy-related waveforms meeting at least one criteria indicative of a disturbance. For example, a disturbance may be identified due to the duration of a detected electrical event meeting disturbance classification criteria. The disturbance classification criteria may be established, for example, by IEEE Standard 1159-2019 or other standards or ways in which disturbance classification criteria may be defined.

At block 315, each sample of the energy-related waveforms associated with an identified disturbance from block 310 is analyzed and categorized into one of a plurality of disturbance categories. The disturbance categories may include, for example, (a) voltage sags due to upline electrical system disturbances, (b) voltage sags due to downline electrical system faults, (c) voltage sags due to downline transformer and/or motor magnetization, and (d) voltage sags due to other downline disturbances. Definitions of these example types of disturbance categories are discussed earlier in the Detailed Description section of this disclosure. It is understood that the provided definitions are example definitions and may be more or less expansive, as understood by one of ordinary skill in the art. It is also understood that these disturbance categories are but several of many potential disturbance categories into which each sample of the energy-related waveforms may be categorized, as also understood by one or ordinary skill in the art.

At block 320, a disturbance categorization is determined for the energy-related waveforms (i.e., the complete energy-related waveforms) associated with the identified disturbance based on the categorization of each sample of the energy-related waveforms at block 315. The disturbance categorization may, for example, be selected from one of the disturbance categories noted above (and/or other disturbance categories). As discussed above, disturbances can evolve, and the systems and methods disclosed herein allow the complete measurement to have more than one categorization. For example, as discussed above, a voltage sag measurement may begin as a transformer and/or motor inrush but could end as a fault event.

At block 325, which is optional in some embodiments, one or more actions may be taken/performed based on the disturbance categorization for the energy-related waveforms. For example, in one embodiment the actions may include triggering one or more alarms in response to certain types of disturbances in the electrical system. In some embodiments, one or more actions may be taken in response to the alarm being triggered. For example, the disturbance may be reported, for example, to a system user or operator. Additionally, or alternatively, at least one component in the electrical system may be operated or controlled in response to the disturbance (e.g., to prevent or reduce damage to electrical system equipment). As one example, the at least one component (e.g., a load in the electrical system) may be operated or controlled to change functionality or operating state.

After block 325, the method may end in some embodiments. In other embodiments, the method may return to block 305 and repeat again (e.g., for capturing additional energy-related waveforms, and identifying and categorizing additional disturbances in the electrical system).

It is understood that method 300 may include one or more additional blocks in some embodiments. For example, in embodiments in which the actions taken at block 325 include triggering one or more alarms in response to certain types of disturbances in the electrical system, the method may further include prioritizing the alarms based on importance/criticality of electrical node or location where the disturbance(s) originated. The electrical node or location where the disturbance(s) originated may be determined, for example, based, at least in part, on locations of the IEDs used to capture the energy-related waveforms associated with disturbance. The IED location information (i.e., where within the facility or structure) may be obtained or extracted, for example, from metadata associated with the energy-related waveforms captured at block 305. In accordance with some embodiments of this disclosure, the metadata may also include IED hierarchical information (e.g., how IEDs relate to each other within the monitoring system, etc.) and other data indicative of the context in which the energy-related waveforms were captured.

Additional aspects and advantages of method 300 and other aspects of the invention disclosed herein may be further understood from method 400 discussed below in connection with FIGS. 4-4C. In accordance with some embodiments of this disclosure, method 400 corresponds to an example implementation of method 300. For example, in accordance with some embodiments of this disclosure, one or more of blocks 420-615 of method 400 may correspond to example steps performed at block 315 of method 300. Additionally, one or more of blocks 620-680 of method 400 may correspond to example steps performed at block 320 of method 300. For example, as noted above, at block 320 of method 300 a disturbance categorization is determined for the energy-related waveforms (i.e., the complete energy-related waveforms), with the disturbance categorization selected from a plurality of possible disturbance categorizations. As noted above, the disturbance categorizations may include, for example, (a) voltage sags due to upline electrical system disturbances, (b) voltage sags due to downline electrical system faults, (c) voltage sags due to downline transformer and/or motor magnetization, and (d) voltage sags due to other downline disturbances. In accordance with some embodiments of this disclosure, the disturbance categorization for an energy-related waveform may generally be determined to be a voltage sag (or sags) due to an upline electrical system disturbance (or disturbances) if the determination made at block 680 of method 400 is true. Additionally, in accordance with some embodiments of this disclosure, the disturbance categorization for an energy-related waveform may generally be determined to be a voltage sag (or sags) due to downline electrical system fault (or faults) if the determinations made at any one of blocks 620, 630, 640, and 650 of method 400 is true. Further, in accordance with some embodiments of this disclosure, the disturbance categorization for an energy-related waveform may generally be determined to be a voltage sag (or sags) due to downline transformer and/or motor magnetization if the determination made at block 660 of method 400 is true. Additionally, in accordance with some embodiments of this disclosure, the disturbance categorization for an energy-related waveform may generally be determined to be a voltage sag (or sags) due to other downline disturbances if the determination made at block 670 of method 400 is true.

Additional aspects of the above and other embodiments may be further understood from discussions below.

Referring now to FIGS. 4-4C, several flowcharts illustrate an example method 400 for automatically categorizing disturbances in an electrical system. Similar to method 300, method 400 may be implemented, for example, on a processor of at least one IED (e.g., 121, shown in FIG. 1) and/or remote from the at least IED, for example, in at least one of: a cloud-based system, on-site software, a gateway, or another head-end system.

Before discussing method 400 further, for convenience, certain acronyms used in the description of this method and shown in the corresponding figures are collected here.
"RMS" refers to root mean square;
"CbC" refers to cycle-by-cycle;
"SLG" refers to single-line-to-ground;
"LL" refers to line-to-line;
"LLG" refers to line-to-line-to-ground; and
3Ø refers to three-phase.

As illustrated in FIG. 4, the method 400 begins at block 405, where an electrical disturbance occurs in an electric power system (also sometimes referred to herein as an electrical system).

At block 410, one or more IEDs record energy measurements in the electrical system. The energy measurements include energy-related measurements as waveforms (as illustrated by block 415). To this effect, the energy-related measurements are also sometimes referred to as energy-related waveform measurements, energy-related waveforms, or simply waveform measurements. The energy-related waveform measurements/energy-related waveforms/waveforms may, for example, include voltage and/or current measurements (as illustrated in block 415). The energy-related waveform measurements/energy-related waveforms/waveforms may additionally or alternatively include power waveforms, derivatives of voltage, current and/or power waveforms, integrals of voltage, current and/or power waveforms, etc.

In some embodiments, at block 410 the one or more IEDs use an internal algorithm designed to detect a voltage sag and/or another type of disturbance using an algorithm that compares waveform points or root mean square (rms) values. The triggering algorithm will cause an energy-related waveform to be recorded for durations typically between one cycle and 120 cycles. A cycle is defined as the time period for one rise and fall of the sinusoidal voltage waveform supplying an electrical node. As is known, power systems in North America oscillate sixty times per second, or 60 Hz.

At block 420, a software module incorporating the invention will process the waveform measurements automatically. The processing can be run on at least one of the one or more IEDs, on edge server software, or on a cloud server, for example. In some embodiments, prior to being processed, measurements can be downloaded from remote IEDs to local servers and/or uploaded to cloud servers.

At block 425, waveforms from one or more measurements can be combined in chronological order by the software module incorporating the invention by preserving the differences in time between the measurements. Temporal aggregation may be used, for example, to group measurements that occurred close in time together. Grouping logic can be based on the start time of measurements being close in time (for example, a difference of less than one second) or with the end of one measurement being close in time to the start of the next measurement (for example, a difference of less than one millisecond). The temporally aggregated measurements will be known as the "temporally aggregated event".

At block 430, if different channels of a waveform measurement were sampled at different rates, then the software module incorporating the invention will be downsampled to the slowest sampling rate. Optionally, the algorithm allows for waveform measurements recorded at a relatively fast rate (for example 2048 samples per cycle) to a slower rate (for example, 64 points per cycle) to decrease computation time.

At block 435, certain channels missing from the measurement can be estimated by the software module if the monitoring instrument is accompanied by estimates on the impedance of the voltage source (as indicated at block 440).

At block 445, the software module incorporating the invention will derive voltage and current phasors using Fourier transforms computed on the first cycle of the measurement.

At block 450, the software module incorporating the invention compares phasor voltages derived for the first cycle of the measurement to user-defined nominal voltage (as indicated at block 455). The nominal voltage can also be derived automatically using an algorithm that estimates a "floating" nominal voltage based on slow changes in voltage (that is, changes in phasor voltage magnitude over ten minutes). If the software module determines that the derived nominal voltage on one of the phase voltages is between about 90% and about 110% of nominal voltage, then the cycle will be labeled as "nominal." If the first cycle of the temporally aggregate event is determined to be a voltage sag or a voltage swell, then the software module incorporating this algorithm will stop processing the measurement (as indicated at block 460). In some embodiments, the 90% and 110% nominal voltage thresholds can be overridden by user-provided thresholds. Additionally, in some embodiments the nominal voltage thresholds may be automatically determined by the software module.

At block 465, the software module incorporating the invention compares phasor currents derived for the first cycle of the measurement to user-defined minimum levels of load current, such as 50 amps (as indicated at block 470). If the phasor current for any phase of the first measurement is below the minimum level of load current, then the software module incorporating this algorithm will stop processing the measurement (as indicated at block 475).

At block 480, the first cycle of the current waveform for each phase will be subtracted (i.e., removed) from each successive cycle by matching sample points that were sampled N cycles after the first cycle. N is computed by using a cycle counter that is initialized to zero for the first cycle of the chronological first waveform and is incremented with each cycle while processing each cycle for each phase of the temporarily aggregated measurement.

At block 485, the second harmonic current is computed for each phase using a Fourier transform of a one cycle window, slid cycle-by-cycle through the waveform samples of the temporally aggregate event. The one cycle derivation window can be slid one cycle at a time or in increments of time as short as the sampling rate of the waveform samples themselves. The maximum second harmonic current magnitude across all phases is recorded.

At block 490, the voltage and current are processed using a one cycle window, slid cycle-by-cycle through the waveform samples of the temporally aggregate event. The one cycle derivation window can be slid one cycle at a time or in increments of time as short as the sampling rate of the waveform samples themselves. Example computations include: time-axis symmetry ratio of current waveform, voltage phasors at fundamental frequency, current phasors at fundamental frequency, current total harmonic distortion (THD), positive-sequence symmetrical components, and second harmonic current (as indicated by blocks 495, 500, 505, and 510).

At blocks 515, 520, 525 and 530, the software incorporating the invention will determine True/False flags (i.e., assign cycle-by-cycle flags on inrush) on whether each analyzed one-cycle window meets all of the following criteria: current waveform is asymmetrical, voltage phasor magnitude is between about 80% of nominal voltage and about 110% of nominal voltage, positive-sequence voltage is between about 80% and about 120% of nominal voltage, and the second harmonic current is more than a user-defined percentage (e.g., between about 20% and about 35%) of the maximum second harmonic current value for the phase of the temporary aggregated waveform event. With respect to the voltage phasor magnitude being between about 80% of nominal voltage and about 110% of nominal voltage, a fundamental voltage outside this range would suggest that we have a fault event rather than inrush. Additionally, with respect to the positive-sequence voltage being between about 80% and about 120% of nominal voltage, a positive-sequence voltage outside this range would suggest that we have a fault event rather than inrush. Further, with respect to the second harmonic current being more than a user-defined percentage of the maximum second harmonic current value for the phase of the temporary aggregated waveform event, as the inrush current signal exponentially decays, there will be some residual second harmonic current measured. Once the second harmonic current drops below a user-defined percentage (e.g., between about 20% and about 35%, as noted above) of the maximum value seen (per phase), then it will be difficult to use second harmonic as an indicator that there is inrush. Therefore, the flag is disabled once it goes below, for example, 35% of the peak value. It is understood that any of the above and below described "user-defined thresholds" (or cutoff thresholds) may be automated thresholds in accordance with embodiments of this disclosure.

At block 535, true power is computed by averaging the product of voltage and current over one cycle. That is, P=1/T Integral[t=0 to T](p(t)·dt. This equation is known art. Additionally, at block 540, the change in load is computed by subtracting the true power measured at the end of the temporally aggregated event from the true power measured at the start. If it is determined the normalized difference in true power is positive and is more than a user-defined threshold (for example, 5%), then the load increase flag will be set at block 545.

At block 550, voltage and current symmetrical components are computed cycle-by-cycle. In particular, in one embodiment the voltage and current symmetrical components are computed for the fundamental frequency using a Fourier transform of a one cycle window couple with the symmetrical component transform[4], slid cycle-by-cycle through the waveform samples of the temporally aggregate event. The one cycle derivation window can be slid one cycle at a time or in increments of time as short as the sampling rate of the waveform samples themselves.

[4] Clarke, Edith (1943). Circuit analysis of A-C power systems. J. Wiley & Sons, Inc.

At block 555 and 560, voltage and current symmetrical components are analyzed cycle-by-cycle. In one embodiment, if positive-sequence voltage is less than about 90% to about 95% of the voltage of the first cycle (as indicated at block 555 in which it is determined if the positive sequence voltage is less than about 95% of the voltage of the first cycle), then the current symmetrical components will be analyzed to determine if the current cycle shows a single-line-to-ground (SLG) fault (as indicated by block 570), if the current cycle shows a line-line-to-ground (LLG) fault (as indicated by block 590), if the current cycle shows a line-line (LL) fault, (as indicated by block 600) or if the current cycle shows a three-phase (3θ) fault (as indicated by block 610). This analysis will result in Cycle-by-Cycle (CbC) Fault Flags (as indicated by blocks 575, 595, 605, 615) with True/False values. Additionally, if the current cycle does not show an SLG fault (e.g., at blocks 570, 580), CbC Inrush Flags are generated at block 585. If positive-sequence voltage is less than about 95% of the voltage of the first cycle, CbC SLG Voltage Sag Flags may be generated (e.g., at block 565). In accordance with some embodiments of this disclosure, the ratio between a current increase and a voltage decrease may be used to develop a confidence factor on the fault condition (i.e., disturbance categorization). A current increase without a corresponding voltage reduction would indicate that there is not a fault, for example. In accordance with some embodiments of this disclosure, the confidence factor is a confidence measure of correct identification of the electrical disturbance (e.g., fault condition).

In one example implementation, the confidence factor is determined by weighing the output for the characteristic that matches the conditions required for a positive inrush characterization (i.e., the conditions checked at blocks 515, 520, 525, and 530) such that certain conditions have a larger influence on the cycle-by-cycle inrush check computed at block 585. In this example implementation, the True/False flag at block 585, for example, may be converted to a percentage score ranging from 0 to 100. The confidence factor may also be determined at block 660, for example, as discussed further below, where the requirement for 100% of the specified number of consecutive cycle-by-cycle values showing a positive inrush characteristic can be modified to a percentage of consecutive cycles.

In some embodiments, the disturbance categorization (or identification of the electrical disturbance) as determined in the above and below blocks may be determined response to the confidence factor of the disturbance characterization meeting a threshold (e.g., a user-defined threshold). In accordance with some embodiments of this disclosure, different elements or portions of the electrical system may have different confidence factor threshold levels, such as based on functional types of the elements. Additionally or alternatively, an overall average confidence threshold can also be used. In some embodiments, if the confidence factor does not meet the threshold, the system or systems on which the method is implemented can indicate that an electrical disturbance has not occurred, or determine that further information is needed to characterize the disturbance. If it is determined that further information is needed, additional information (e.g., energy-related waveforms, images, video, or other sensor information or requests for confirmation of information extracted from the images or video) may be captured and analyzed.

Returning now to more detailed discussions about disturbance characterization, after the above-discussed blocks the software incorporating this algorithm will analyze all of the cycle-by-cycle flags for SLG Fault, LLG Fault, Fault, LL Fault, 3Ø Fault together, coincident for each phase. If the temporally aggregated event has cycle-by-cycle one or more 3Ø Fault Flags set to true (as determined at block 620), then the temporally aggregated event is labeled as a three-phase fault (as indicated at block 625). In one example implementation, prior to labeling the temporarily aggregated event as a three-phase fault at block 625, several further characteristics of the temporarily aggregated event may be analyzed to distinguish between a three-phase fault and a three-phase load start-up, which can look nearly identical in some instances. For example, if the last fault of the temporarily aggregated event is a three-phase fault, it may be further determined if: (a) the last cycle of the last fault of the measurement was a three-phase fault, (b) the voltage is lower than a user-specified voltage (e.g., 1000 volts) (or if the load is identified as being primarily three-phase load), and (c) no other faults are associated with the event (e.g., as determined at subsequent blocks shown in FIG. 4C, as described further below). In accordance with some embodiments of this disclosure, in response to (a), (b) and (c) being true, it may be determined that the final three-phase fault was actually a load start event, and the temporally aggregated event may be labeled as a load start event.

Otherwise, if the temporally aggregated event has one or more cycle-by-cycle LLG Fault Flags set to true (as determined at block 630), then the temporally aggregated event is labeled as an LLG fault (as indicated at block 635). Otherwise, if the temporally aggregated event has one or more cycle-by-cycle LL Fault Flags set to true (as determined at block 640), then the temporally aggregated event is labeled as a LL fault (as indicated at block 645). Otherwise, if the temporally aggregated event has one or more cycle-by-cycle SLG Fault Flags set to true (as determined at block 650), then the temporally aggregated event is labeled as a SLG fault (as indicated at block 655). Three-phase faults, LLG faults, LL faults and SLG faults are example types of events that may be due to a voltage sag (or voltage sags) due to downline electrical system faults, as defined above. Example voltage sags due to downline electrical system faults are shown in FIGS. 7 and 8, for example, as discussed further below.

If none of the above flags (i.e., three-phase fault, LLG fault, LL fault and SLG fault) is true, the method proceeds to block 660. At block 660, if the temporally aggregated event has cycle-by-cycle Inrush Flags set to true, and the Inrush Flags are true for at least four to six cycles or another user-defined number of cycles (as determined at block 660), then the temporally aggregated event is labeled as an inrush event (as indicated at block 665). An inrush event is one example type of event that may be due to a voltage sag (or voltage sags) due to a downline transformer and/or motor magnetization, as defined above. Example voltage sags due to downline transformer and/or motor magnetization are shown in FIGS. 5 and 6, for example, as discussed further below.

If it is determined that the temporally aggregated event does not have cycle-by-cycle Inrush Flags set to true, and the Inrush Flags are not true for at least four to six cycles or another user-defined number of cycles (i.e., the determination made at block 660 is false), the method proceeds to block 670. At block 670, if the event shows an increase in true power of more than user-defined amounts of kilowatts by comparing the last cycle of the temporally aggregated event with the first cycle of the temporally aggregated event (as determined at block 670), then the temporally aggregated event is labeled as a load startup event (as indicated at block 675). A load startup event is one example type of event that may be due to a voltage sag (or voltage sags) due to other downline disturbances, as defined above. Example voltage sags due to other downline disturbances are shown in FIGS. 10 and 11, for example, as discussed further below.

If it is determined that the event does not show an increase in true power of more than the user-defined amounts (i.e., the determination made at block 670 is false), the method proceeds to block 680. At block 680, the temporally aggregated event is labeled as a voltage sag due to an upline electrical system disturbance, or simply an upline voltage sag (as indicated at block 680). Example voltage sags due to upline electrical system disturbances are shown in FIG. 9, for example, as discussed further below.

After block 680, the method may end in some embodiments. In other embodiments, the method may return to block 405 (or another block) and repeat again (e.g., for capturing additional energy-related waveforms, and identifying and categorizing additional disturbances in the electrical system).

It is understood that method 400 may include one or more additional blocks in some embodiments, for example, similar to those described above in connection with method 300.

Referring to FIGS. 5-11, several example waveforms (and samples) are shown. FIG. 5, for example, shows example voltage and current waveforms recorded during a transformer inrush. Additionally, FIG. 6 shows an example current waveform recorded during a motor inrush. As illustrated, the motor inrush current shown in FIG. 6 exhibits similar non-symmetrical characteristics as the transformer inrush shown in FIG. 5.

FIG. 7 shows example voltage and current waveforms recorded during a single-phase fault event. Additionally, FIG. 8 shows example voltage and current waveforms recorded during a transformer inrush followed by a single-phase fault. FIG. 9 shows example voltage and current waveforms recorded during an upline voltage sag. Additionally, FIG. 10 shows example voltage and current waveforms recorded during a load startup. FIG. 11 shows example voltage and current root-mean-square (rms) samples recorded during a load startup.

In accordance with some embodiments of this disclosure, the waveforms (and samples) shown in FIGS. 5-11 may be indicative of waveforms (and samples) that may be captured using the systems and methods disclosed herein.

As described above and as will be appreciated by those of ordinary skill in the art, embodiments of the disclosure herein may be configured as a system, method, or combination thereof. Accordingly, embodiments of the present disclosure may be comprised of various means including hardware, software, firmware or any combination thereof.

It is to be appreciated that the concepts, systems, circuits and techniques sought to be protected herein are not limited to use in the example applications described herein (e.g., power monitoring system applications) but rather, may be useful in substantially any application where it is desired to categorize disturbances in an electrical system. While particular embodiments and applications of the present disclosure have been illustrated and described, it is to be understood that embodiments of the disclosure not limited to the precise construction and compositions disclosed herein and that various modifications, changes, and variations can be apparent from the foregoing descriptions without departing from the spirit and scope of the disclosure as defined in the appended claims.

Having described preferred embodiments, which serve to illustrate various concepts, structures and techniques that are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

What is claimed is:

1. A method for automatically categorizing disturbances in an electrical system, comprising:
   capturing at least one energy-related waveform using at least one intelligent electronic device (IED) in the electrical system;
   processing electrical measurement data from, or derived from, the at least one energy-related waveform to identify disturbances in the electrical system;
   in response to identifying the disturbances in the electrical system, analyzing and categorizing each sample of the at least one energy-related waveform associated with the identified disturbances into one of a plurality of disturbance categories, the disturbance categories including: (a) voltage sags due to upline electrical disturbances, (b) voltage sags due to downline electrical system faults, (c) voltage sags due to downline transformer and/or motor magnetization, and (d) voltage sags due to other downline disturbances;
   determining a disturbance categorization for the at least one energy-related waveform associated with the identified disturbances based on the categorization of each sample of the at least one energy-related waveform, the disturbance categorization being selected from one of the disturbance categories; and
   taking at least one action based on the disturbance categorization for the at least one energy-related waveform.

2. The method of claim 1, wherein the at least one energy-related waveform includes at least one of: voltage waveforms, current waveforms, and other waveforms and/or data derived from the voltage waveforms and/or the current waveforms.

3. The method of claim 2, wherein the voltage waveforms and the current waveforms are at least one of: single-phase and three-phase voltage and current waveforms.

4. The method of claim 1, wherein processing electrical measurement data from, or derived from, the at least one energy-related waveform to identify disturbances in the electrical system, includes: determining voltage and current phase information of the electrical measurement data associated with the disturbances, and analyzing the voltage and current phase information to determine if the source(s) of the disturbances is/are electrically upstream or downstream from electrical nodes or locations in the electrical system where the at least one IED is electrically coupled.

5. The method of claim 1, wherein processing electrical measurement data from, or derived from, the at least one energy-related waveform to identify disturbances in the electrical system, includes: grouping the electrical measurement data based on electrical nodes or locations in the electrical system associated with the at least one energy-related waveform, and processing the grouped electrical measurement data to identify disturbances at the electrical nodes or locations.

6. The method of claim 5, wherein the electrical measurement data is grouped using temporal aggregation techniques such that measurements that occurred proximate in time are grouped together.

7. The method of claim 6, further comprising:
   determining sampling rates at which the at least one energy-related waveform associated with the electrical measurement data was captured, and adjusting the sampling rates of the electrical measurement data to a desired sampling rate to at least one of align and group the electrical measurement data.

8. The method of claim 7, wherein the sampling rates the electrical measurement data are adjusted by upsampling, downsampling and/or resampling the electrical measurement data.

9. The method of claim 7, wherein the desired sampling rate is a lowest sampling rate of the sampling rates at which the at least one energy-related waveform associated with the electrical measurement data was captured.

10. The method of claim 1, wherein determining a disturbance categorization for the at least one energy-related waveform, includes: analyzing the categorization of each sample of the at least one energy-related waveform to develop a confidence factor on a disturbance categorization for the at least one energy-related waveform, and in response to the confidence factor of the disturbance characterization meeting a threshold, determining the disturbance categorization for the at least one energy-related waveform.

11. The method of claim 10, wherein analyzing the categorization of each sample of the energy-related waveforms includes identifying categorization patterns of the energy-related waveform samples.

12. The method of claim 1, wherein taking one or more actions based on the disturbance categorization includes triggering one or more alarms based on the disturbance categorization.

13. The method of claim 12, wherein the alarms are prioritized based on importance/criticality of electrical node or location where the disturbance originated.

14. The method of claim 12, wherein the alarms are prioritized based on size of the load measured at the electrical node or location where the disturbance.

15. The method of claim 12, further comprising: in response to the alarms being triggered, reporting the disturbance and/or operating at least one component in the electrical system in response to the disturbance to prevent or reduce damage to electrical system equipment.

16. The method of claim 1, wherein the one or more actions are automatically performed by a control system associated with the electrical system, wherein the control system is communicatively coupled to the at least one IED, and/or to a cloud-based system, on-site/edge software, a gateway, and another head-end system associated with the electrical system.

17. The method of claim 16, wherein the electrical measurement data from, or derived from, the at least one energy-related waveform captured by the at least one IED is processed on at least one of: the cloud-based system, the on-site software, the gateway, and the other head-end system associated with the electrical system, wherein the at least one IED is communicatively coupled to the at least one of: the cloud-based system, the on-site software, the gateway, and the other head-end system on which the electrical measurement data is processed.

18. A system for automatically categorizing disturbances in an electrical system, comprising:
a processor;
a memory device coupled to the processor, the processor and the memory device configured to:
process electrical measurement data from, or derived from, at least one energy-related waveform captured by at least one intelligent electronic device (IED) in the electrical system to identify disturbances in the electrical system;
in response to identifying the disturbances in the electrical system, analyze and categorize each sample of the at least one energy-related waveform associated with the identified disturbances into one of a plurality of disturbance categories, the disturbance categories including: (a) voltage sags due to upline electrical disturbances, (b) voltage sags due to downline electrical system faults, (c) voltage sags due to downline transformer and/or motor magnetization, and (d) voltage sags due to other downline disturbances;
determine a disturbance categorization for the at least one energy-related waveform associated with the identified disturbances based on the categorization of each sample of the at least one energy-related waveform, the disturbance categorization being selected from one of the disturbance categories; and
take at least one action based on the disturbance categorization for the at least one energy-related waveform.

19. The system of claim 18, wherein the disturbances are identified by grouping the electrical measurement data based on electrical nodes or locations in the electrical system associated with the at least one energy-related waveform, and processing the grouped electrical measurement data to identify the disturbances at the electrical nodes or locations.

20. The system of claim 18, wherein the disturbance categorization for the at least one energy-related waveform is determined by analyzing the categorization of each sample of the at least one energy-related waveform to develop a confidence factor on a disturbance categorization for the at least one energy-related waveform, and in response to the confidence factor of the disturbance characterization meeting a threshold, determining the disturbance categorization for the at least one energy-related waveform.

21. The system of claim 18, wherein the one or more actions include triggering one or more alarms based on the disturbance categorization.

22. The system of claim 21, wherein in response to the alarms being triggered, the disturbance is reported and/or at least one component in the electrical system is operated in response to the disturbance to prevent or reduce damage to electrical system equipment.

23. The system of claim 18, wherein the one or more actions include generating an output signal in accordance with the disturbance categorization, and providing the output signal to at least one device for further processing.

24. The system of claim 18, wherein the at least one device includes at least one of: the at least one TED, a control system associated with the electrical system, a cloud-based system, on-site/edge software, a gateway, and another head-end system associated with the electrical system.

* * * * *